(12) United States Patent
Khalil et al.

(10) Patent No.: US 10,593,619 B1
(45) Date of Patent: Mar. 17, 2020

(54) TRANSISTOR SHIELD STRUCTURE, PACKAGED DEVICE, AND METHOD OF MANUFACTURE

(71) Applicant: NXP USA, Inc., Austin, TX (US)

(72) Inventors: Ibrahim Khalil, Gilbert, AZ (US); Charles John Lessard, Gilbert, AZ (US); Damon G. Holmes, Scottsdale, AZ (US); Hernan Rueda, Chandler, AZ (US)

(73) Assignee: NSP USA, Inc., Austin, TX (US)

( * ) Notice: Subject to any disclaimer, the term of this patent is extended or adjusted under 35 U.S.C. 154(b) by 0 days.

(21) Appl. No.: 16/114,468

(22) Filed: Aug. 28, 2018

(51) Int. Cl.
| H01L 23/522 | (2006.01) |
| H01L 21/3205 | (2006.01) |
| H01L 21/768 | (2006.01) |
| H01L 21/8234 | (2006.01) |
| H01L 23/528 | (2006.01) |
| H01L 23/66 | (2006.01) |

(Continued)

(52) U.S. Cl.
CPC .... *H01L 23/5225* (2013.01); *H01L 21/32051* (2013.01); *H01L 21/76802* (2013.01); *H01L 21/823475* (2013.01); *H01L 23/4824* (2013.01); *H01L 23/528* (2013.01); *H01L 23/5226* (2013.01); *H01L 23/66* (2013.01); *H01L 27/0203* (2013.01); *H01L 2223/6644* (2013.01)

(58) Field of Classification Search
CPC . H01L 23/5225; H01L 23/4824; H01L 23/66; H01L 23/528; H01L 21/823475; H01L 21/76802; H01L 21/32051; H01L 23/5226; H01L 27/0203; H01L 2223/6644
See application file for complete search history.

(56) References Cited

U.S. PATENT DOCUMENTS

| 5,151,770 A | 9/1992 | Inoue |
| 5,309,012 A | 5/1994 | Jex et al. |

(Continued)

FOREIGN PATENT DOCUMENTS

| JP | 2013 247618 A | 12/2013 |
| WO | WO-2010/016008 A1 | 7/2014 |

OTHER PUBLICATIONS

U.S. Appl. No. 15/715,623; Not Yet Published; 33 pages; (dated Sep. 26, 2017).

*Primary Examiner* — Marcos D. Pizarro
*Assistant Examiner* — Sue Tang
(74) *Attorney, Agent, or Firm* — Charlene R. Jacobsen

(57) ABSTRACT

A transistor includes a semiconductor substrate having a first terminal and a gate region, and an interconnect structure formed of multiple layers of dielectric and electrically material on an upper surface of the semiconductor substrate. The electrically conductive material includes first and second layers, the second layer being spaced apart from the first layer by a first dielectric layer of the dielectric material, the first layer residing closest to the upper surface of the semiconductor substrate relative to the second layer. The interconnect structure includes a pillar formed from the conductive material. The pillar is in electrical contact with the first terminal, the pillar extends through the dielectric material, and the pillar includes a pillar segment in the first layer of the conductive material. The interconnect structure also includes a shield structure in the first layer of the conductive material and positioned between the pillar segment and the gate region.

17 Claims, 10 Drawing Sheets

(51) Int. Cl.
  *H01L 23/482* (2006.01)
  *H01L 23/58* (2006.01)
  *H01L 27/02* (2006.01)

(56) References Cited

U.S. PATENT DOCUMENTS

| | | | |
|---|---|---|---|
| 5,742,082 | A | 4/1998 | Tehrani et al. |
| 7,135,766 | B1 | 11/2006 | Costa et al. |
| 7,446,441 | B2 | 11/2008 | Enomoto et al. |
| 7,859,047 | B2 | 12/2010 | Kraft et al. |
| 8,502,311 | B2 * | 8/2013 | Theeuwen .......... H01L 29/7835 257/340 |
| 8,513,782 | B2 | 8/2013 | Bakalski et al. |
| 8,680,615 | B2 | 3/2014 | Mitra et al. |
| 9,209,259 | B2 | 12/2015 | Mitra et al. |
| 9,462,674 | B1 | 10/2016 | Fakhruddin et al. |
| 9,653,410 | B1 * | 5/2017 | Holmes ................ H01L 23/552 |
| 2004/0124524 | A1 | 7/2004 | Aumuller et al. |
| 2010/0078778 | A1 | 4/2010 | Barth et al. |
| 2010/0182078 | A1 | 7/2010 | Cantoni |
| 2010/0230780 | A1 * | 9/2010 | Obayashi ............... G11C 17/18 257/529 |
| 2011/0102077 | A1 | 5/2011 | Lamey et al. |
| 2014/0002188 | A1 | 1/2014 | Chen et al. |
| 2014/0070365 | A1 | 3/2014 | Viswanathan et al. |
| 2014/0103420 | A1 | 4/2014 | Liu et al. |

* cited by examiner

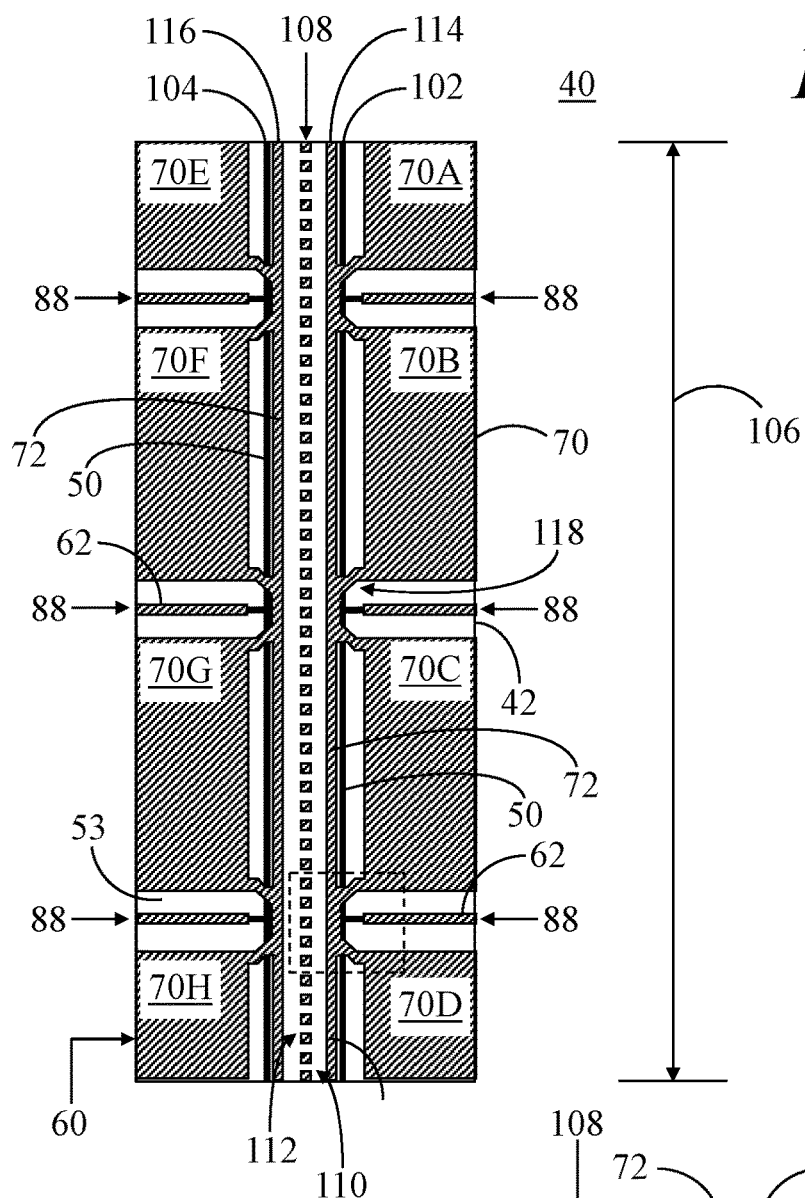
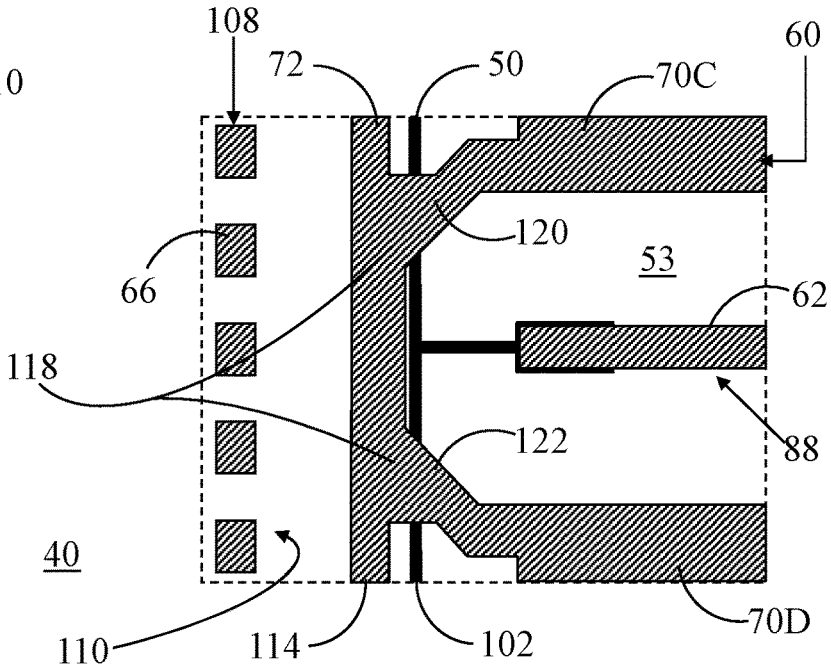
FIG. 3
FIG. 4

US 10,593,619 B1

TRANSISTOR SHIELD STRUCTURE, PACKAGED DEVICE, AND METHOD OF MANUFACTURE

TECHNICAL FIELD OF THE INVENTION

The present invention relates generally to field effect transistors. More specifically, the present invention relates to a field effect transistor having a shield structure between the input and output of the active device, a packaged semiconductor device with the field effect transistor therein, and a method of manufacturing such a field effect transistor.

BACKGROUND OF THE INVENTION

A typical high power semiconductor device package may include one or more input leads, one or more output leads, one or more transistors, wirebonds coupling the input lead(s) to the transistor(s), and wirebonds coupling the transistor(s) to the output lead(s). A field effect transistor (FET) in such a high power semiconductor device package may include interdigitated drain and gate runners. The gate of the FET is driven by an input signal tapped from the gate runner. The tapping of the gate runner can add parasitic feedback capacitance that may reduce amplifier stability and reduce gain.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

FIG. 3 shows a plan view of a portion of the transistor of FIG. 2;

FIG. 4 shows an enlarged plan view of a portion of the transistor enclosed by a dashed line box in FIG. 3;

DETAILED DESCRIPTION

Figure 1:
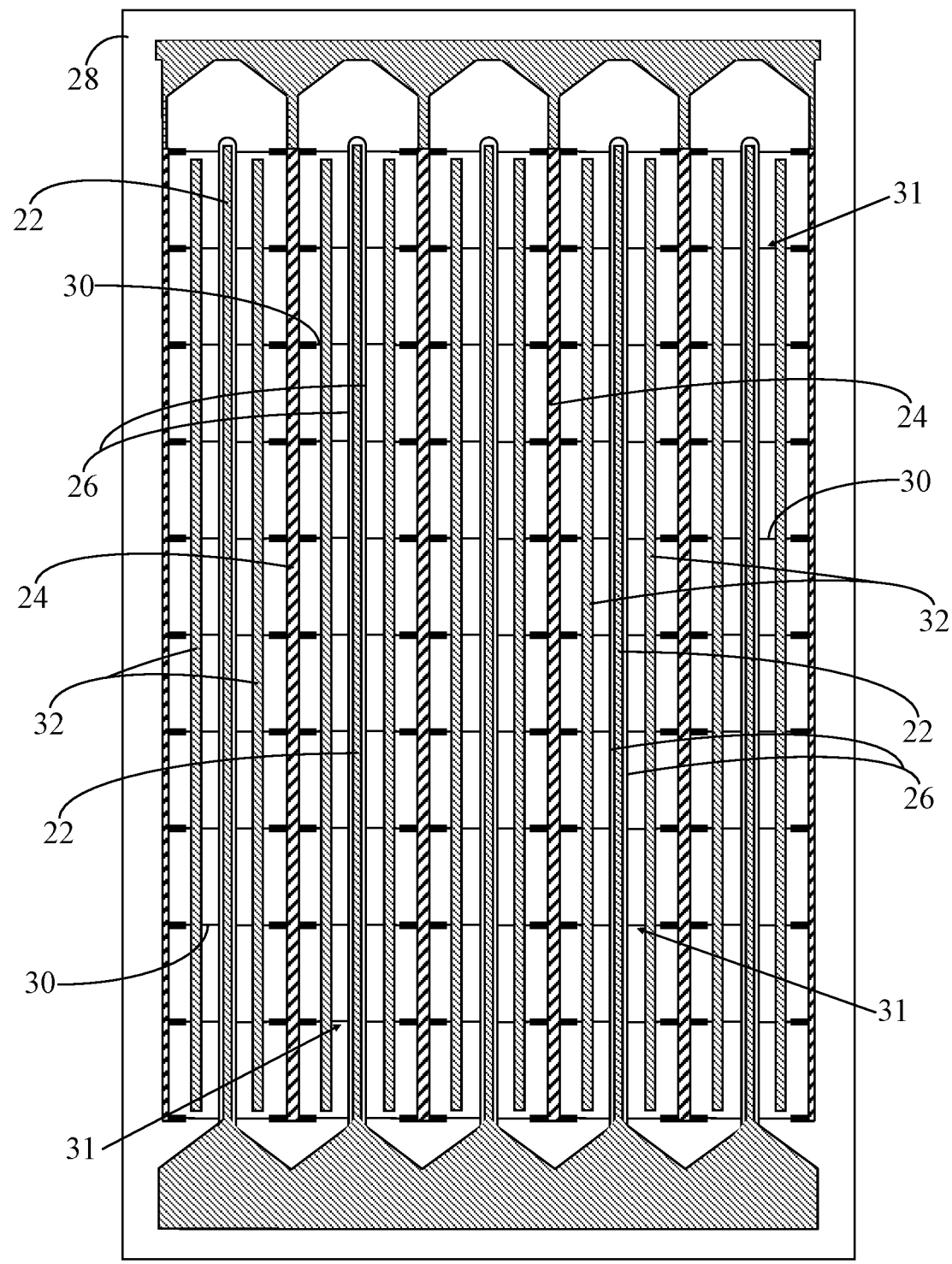
FIG. 1 shows a simplified plan view of an example of a transistor having interdigitated drain and gate fingers.

In overview, embodiments disclosed herein entail a transistor having a shield structure within an interconnect structure of the transistor, an amplifier module having such a transistor, and a method of manufacturing the transistor. More specifically, embodiments can include a shield structure formed in a first conductive layer, sometimes referred to as an M1 layer, of an interconnect structure, in which the first conductive layer resides closest to a top surface of the transistor. The shield structure can include shield traces that are positioned between the gate fingers and the drain of the transistor. The shield traces may be longitudinally aligned with the length of the gate fingers. The shield structure is configured to block electric fields between the input signal tapped from a runner and the output signal carried to another runner of the transistor. The geometry of the shield structure is configured to be small to minimize additional input and output capacitance contributions from the shield structure, and to enable reductions in die size for module applications. The geometry of the shield structure reduces feedback capacitance and thereby improves the gain, contour alignment, and stability of the active device (e.g., transistor).

The following description entails the implementation of a shield structure within an interconnect structure of a field effect transistor (FET) in a non-limiting fashion. Multiple shield traces of the shield structure may be strategically positioned in the first conductive layer of the interconnect structure between the drain pillars and the gate fingers of an interdigitated FET. It should be understood, however, that the shield structure may be implemented within a wide variety of unipolar and bipolar transistor technologies.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

FIG. 1 shows a simplified plan view of an example of a transistor 20 having interdigitated drain and gate runners 22, 24. That is, drain and gate runners 22, 24 are closely positioned relative to one another in an alternating arrangement. Gates 26 generally surround drain regions (not visible) formed within a semiconductor substrate 28 of an intrinsic device underlying drain and gate runners 22, 24. Transistor 20 further includes a plurality of tap interconnects 30 formed from electrically conductive material, typically metal. Tap interconnects 30 are electrically connected between gate runners 24 and gate taps or gate electrodes of gates 26 formed within semiconductor substrate 28. The positions at which tap interconnects 30 are located are referred to herein as tap locations 31. Transistor 20 may include shield runners 32 interposed between each pair of drain and gate runners 22, 24 that may reduce some feedback capacitance between drain and gate runners 22, 24. The interdigitated drain, gate, and shield runners 22, 24, 32 may be formed in one or more metal layers above semiconductor substrate 28.

Figure 2:
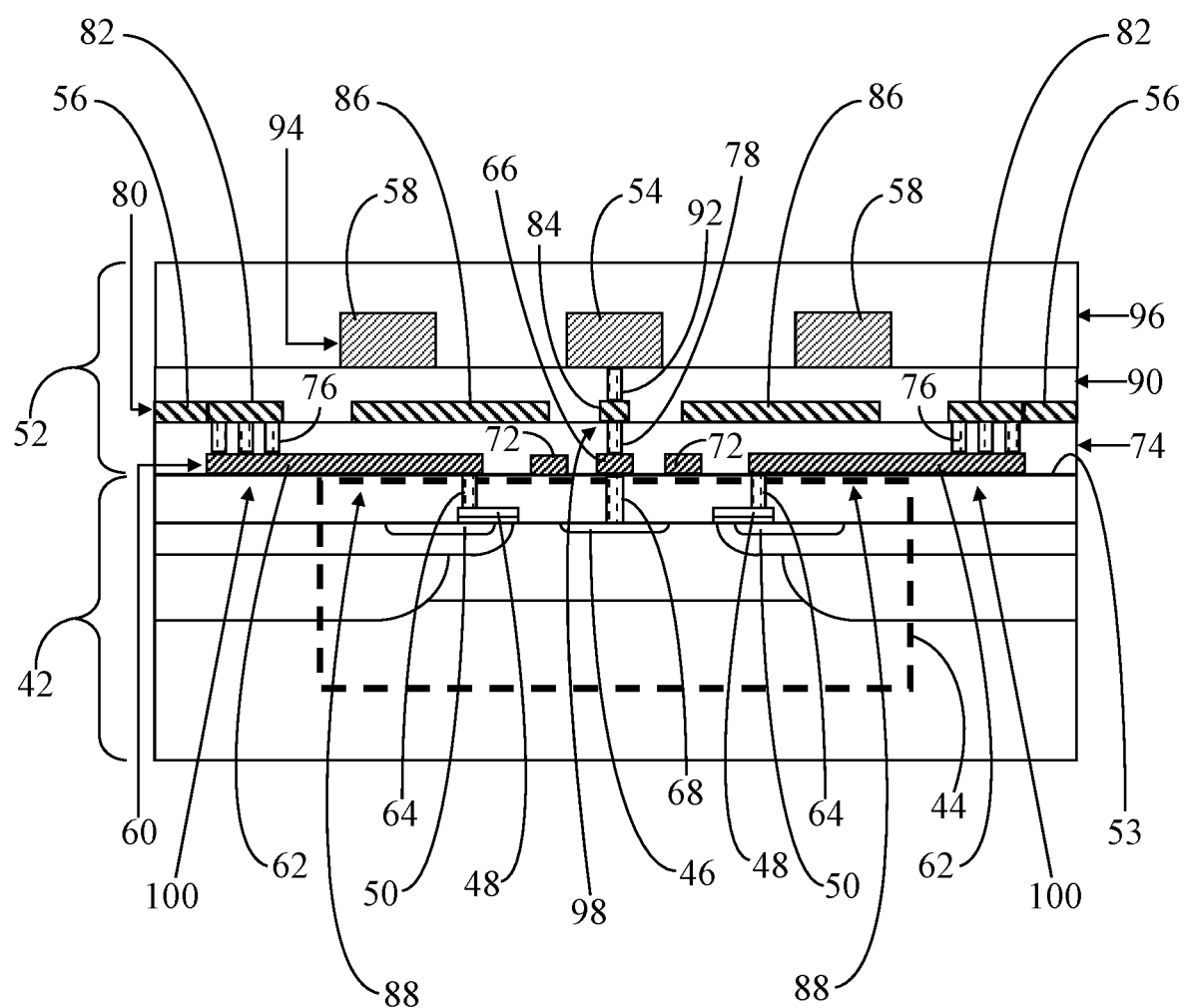
FIG. 2 shows a side sectional view of a portion of a transistor in accordance with an embodiment.

Referring now to FIG. 2, FIG. 2 shows a side sectional view of a portion of a transistor 40 in accordance with an embodiment. Transistor 40 includes a semiconductor substrate 42 having an intrinsic active device, e.g., a FET 44, formed therein, represented generally by a dashed line box. FET 44 within semiconductor substrate 42 includes, among other features, a first terminal, referred to herein as a drain region 46 and a second terminal, referred to herein as gate electrodes 48. Gate electrodes 48 are electrically coupled to gate regions 50 of FET 44. Further details of FET 44 are known to those skilled in the art and are therefore not described herein for brevity. It bears repeating that although a FET design is discussed herein, a wide variety of unipolar and bipolar transistor technologies may alternatively be implemented.

An interconnect structure 52 is formed on an upper surface 53 of semiconductor substrate 42. In general, interconnect structure 52 of transistor 40 includes a plurality of interdigitated first and second runners, i.e., drain and gate runners 54, 56. Additionally, interconnect structure 52 includes a plurality of shield runners 58 interposed between each drain and gate runner 54, 56. Only a single drain runner 54, two gate runners 56, and two shield runners 58 are shown in the side sectional view of FIG. 2 for simplicity of illustration. It should be understood however, that transistor 40 may be configured to include the multiplicity of drain, gate, and shield runners as represented by transistor 20 in FIG. 1.

Interconnect structure 52 may be formed of multiple layers of dielectric material and electrically conductive material. In the illustrated configuration, a first conductive layer 60 (represented by dark upwardly and rightwardly directed narrow hatching) is suitably formed on upper surface 53 of semiconductor substrate 42 to include first tap interconnect segments 62 (two shown) electrically connected to gate electrodes 48 by way of electrically conductive vias 64, and first drain segments 66 (one shown) electrically connected to drain region 46 by way of an electrically conductive via 68. Additionally, a ground plane 70 (see FIG. 3) is formed in first conductive layer 60 on upper surface 53. Ground plane 70 will be described in greater detail below.

In accordance with an embodiment, a first shield structure 72 is formed in first conductive layer 60 on upper surface 53. First shield structure 72 is positioned between first drain segments 66 and gate regions 50. First shield structure 72 will be described in significantly greater detail below. Other structures may additionally be formed on upper surface 53 of semiconductor substrate 42 that are not illustrated herein for simplicity.

A first dielectric material layer 74 is formed over first conductive layer 60. Electrically conductive vias 76, 78 may be suitably formed extending through first dielectric material layer 74. By way of example, electrically conductive vias 76 extend through first dielectric material layer 74 and are in electrical contact with first tap interconnect segments 62. Likewise, electrically conductive via 78 extends through first dielectric layer 74 and is in electrical contact with first drain segments 66.

A second electrically conductive layer 80 (represented by downwardly and rightwardly directed wide hatching) is suitably formed on first dielectric material layer 74. Second electrically conductive layer 80 includes second tap interconnect segments 82 in electrical contact with conductive vias 76. Second electrically conductive layer 80 further includes a drain segment 84 in electrical contact with conductive via 78. In some embodiments, second electrically conductive layer 80 includes a second shield structure 86 interposed between second tap interconnect segments 82 and drain segment 84. In this illustrated configuration, second tap interconnect segments 82 serve as gate transmission lines interconnecting vias 76 with gate runners 56 also formed in second electrically conductive layer 80. Thus, collectively, first tap interconnect segment 62, vias 76, and second tap interconnect segment 82 yield individual tap interconnects 88 between gate regions 50/vias 64/gate electrodes 48 and gate runners 56. Only two tap interconnects 88 are illustrated in FIG. 2 for clarity. However, it should be understood that transistor 40 may include a plurality of tap interconnects 88 in accordance with a configuration of interdigitated drain and gate runners like that shown in FIG. 1.

A second dielectric material layer 90 is formed over second tap interconnect segments 82, gate runners 56, drain segment 84, and second shield structures 86 of second electrically conductive layer 80. In this example, an electrically conductive via 92 may be suitably formed extending through second dielectric material layer 90 and is in electrical contact with drain segment 84. A third electrically conductive layer 94 (represented by upwardly and rightwardly directed narrow hatching) is formed on second dielectric material layer 90. In this example, drain runner 54 and shield runners 58 are formed in third electrically conductive layer 94. Thereafter, a third dielectric material layer 96 may be formed over drain runner 54 and shield runners 58. Drain runner 54 is in electrical contact with electrically conductive via 92. Thus, collectively, the combination of first drain segment 66, via 78, second drain segment 84, and via 92 yield a drain pillar 98 for transistor 40 that electrically interconnects drain region 46/via 68 of intrinsic FET 44 to drain runner 54.

In general, gate regions 50 of intrinsic FET 44 are driven by an input signal tapped from gate runners 56 via tap interconnects 88 to gate electrodes 48 at tap locations 100. Thus, tap locations 100 are the positions where tap interconnects 88 approach drain pillar 98 within interconnect structure 52. The potential for undesirable feedback capacitance imposed upon the output metallization (i.e., drain pillar 98) is greatest along gate regions 50 and at the input metallization (i.e., tap interconnects 88). That is, the input signal tapped from gate runners 56 can add parasitic feedback capacitance, sometimes referred to as Co, to an output signal from drain runner 54. This parasitic feedback capacitance can reduce amplifier stability and reduce gain.

Active devices used for RF power amplifier applications suffer from parasitic terminal capacitances that act to reduce RF bandwidth, degrade stability, and reduce gain. Shield traces (described in detail below) of first shield structure 72 are strategically longitudinally aligned with the gate fingers of gate region 50 and are positioned between first drain segments 66 and the gate fingers of gate region 50 to function as the dominant shield for reducing an amount of feedback capacitance, Co, of the active intrinsic device (FET 44). Second shield structures 86 may be positioned near positions where the input interconnections approach the output interconnections (e.g., at tap locations 100). Second shield structures 86 may function as a secondary shield to further reduce the feedback capacitance, $C_{gd}$, in embodiments that include second shield structures 86.

As illustrated above, interconnect structure 52 of transistor 40 includes three electrically conductive (e.g., metal) layers, with first conductive layer 60 residing closest to upper surface 52 of substrate 42 (without an intervening electrically conductive layer of interconnect structure 52) relative to second and third conductive layers 80, 94 and with second conductive layer 80 being interposed between first and third conductive layers 60, 94. A minimal quantity of metal layers within interconnect structure 52 may enable a reduction in fabrication and material costs of interconnect structure 52 relative to interconnect structures having more than three metal layers. Additionally, the three metal layer implementation versus implementations with a greater quantity of metal layers may be beneficial in transistor technologies, such as in gallium nitride (GaN) based transistors. First and second shield structures 72, 86 are connected to ground plane 70 (discussed below) and are strategically placed to block maximum coupling to yield maximum shielding with minimal degradation of other capacitances. Thus, first shield structure 72, and optionally second shield structure 86, can be effectively implemented within the three metal layer design of interconnect structure 52. It should be understood, however, that first shield structure 72 may be alternatively implemented for technologies with more than three metal layers, an example of which is provided in connection with FIG. 10.

Referring now to FIGS. 3 and 4, FIG. 3 shows a plan view of a portion of the transistor 40 and FIG. 4 shows an enlarged plan view of the portion of transistor 40 enclosed by a dashed line box in FIG. 3. FIGS. 3 and 4 are illustrated with various dielectric and electrically conductive material layers removed to reveal first conductive layer 60 (represented by dark upwardly and rightwardly directed narrow hatching) and a portion of the underlying top surface 53 of semiconductor substrate 42. In this example, first conductive layer 60 of interconnect structure 52 (FIG. 1) includes first tap interconnect segments 62, first drain segments 66, ground plane 70, and first shield structure 72. For illustrative purposes, gate region 50 is visible in FIGS. 3 and 4 to highlight the positional relationship of first shield structure 72 relative to first drain segments 66 of drain pillar 98 (FIG. 2) and gate region 50.

Gate region 50 includes a multiplicity of gate fingers, of which two are shown in FIG. 3. The two gate fingers are referred to herein as a first gate finger 102 and a second gate finger 104. First and second gate fingers 102, 104 are characterized by a length 106. In FIG. 3, length 106 is represented by a bi-directional arrow to indicate that length 106 may be considerably longer then shown in FIG. 3. For example, length 106 of first and second gate fingers 102, 104 may be at least as long as gate runners 24 of transistor 20 illustrated in FIG. 1.

Additionally, transistor 40 may include multiple rows 108 (one is represented in FIGS. 3 and 4) of first drain segments 66 of drain pillars 98 (only one is shown in FIG. 2 for clarity) corresponding to the quantity of drain runners 54 (FIG. 2) of transistor 40. Each of drain pillars 98 includes first drain segment 66 formed in first conductive layer 60. The rows 108 of drain pillars 98 may thus interconnect with a drain runner (e.g., drain runner 54 shown in FIG. 2). First and second gate fingers 102, 104 are located on opposing first and second sides 110, 112 of drain segments 66 corresponding to rows 108 of drain pillars 98. However, first and second gate fingers 102, 104 are located in vertical displacement relative to first drain segments 66 since first and second gate fingers 102, 104 are formed in FET 44 (FIG. 2) and drain segments 66 are formed in first conductive layer 60 of interconnect structure 52 (FIG. 2).

Transistor 40 may include a multiplicity of tap interconnects 88 in electrical contact with first and second gate fingers 102, 104 of gate region 50 via gate electrodes 48 (FIG. 2). Each of tap interconnects 88 includes first tap interconnect segment 62 also formed in first conductive layer 60. The multiplicity of tap interconnects 88 may thus interconnect with gate runner (e.g., gate runner 56 shown in FIG. 2). First tap interconnect segments 62 are laterally spaced apart from and therefore electrically isolated from the surrounding material of first conductive layer 60. This surrounding material includes ground plane 70 and first shield structure 72 of transistor 40. In an illustrative example, ground plane 70 includes sections 70A-H shown in FIG. 3. First tap interconnect segments 62 may be formed in the space between adjacent sections 70A-H of ground plane 70.

In accordance with an embodiment, first shield structure 72 includes a first shield trace 114 longitudinally aligned with length 106 of first gate finger 102 and positioned between first gate finger 102 and first side 110 of first drain segments 66 of the multiplicity of drain pillars 98 (FIG. 2). Additionally, first shield structure 72 includes a second shield trace 116 longitudinally aligned with length 106 of second gate finger 104 and positioned between second gate finger 104 and second side 112 of first drain segments 66 of the multiplicity of drain pillars 98 (FIG. 2). First and second shield traces 114, 116 are laterally spaced apart from and therefore electrically isolated from first tap interconnect segments 62 and first drain segments 66. Although only individual first and second shield traces 114, 116 are discussed herein, first shield structure 72 can include multiple first and second shield traces 114, 116 corresponding to the quantity of gate fingers of gate region 50 and rows 108 of drain pillars 98 of transistor 40.

Although first shield structure 72 is electrically isolated from first tap interconnect segments 62 and first drain segments (hence drain pillars 98), first shield structure 72 is electrically connected to ground plane 70. In some embodiments, first shield structure 72 additionally includes a connection structure 118. Connection structure 118 is formed in first conductive layer 60 and overlaps gate region 50 (e.g., portions of first and second gate fingers 102, 104). As more clearly illustrated in the enlarged plan view of FIG. 4, connection structure 118 includes a first portion 120 interconnecting first shield trace 114 to segment 70C of ground plane 70 and a second portion 122 interconnecting first shield trace 114 to segment 70D of ground plane 77. In some embodiments, an electrically non-conductive (e.g., dielectric) material may be located between first and second shield portions 120, 122 and first shield trace 114. Thus, first and second portions 120, 122 of connection structure 118 generally surround the locations of first tap interconnect segments 62.

First and second shield traces 114, 116 formed in first conductive layer 60 and extending lengthwise between gate fingers 102, 104 and first drain segments 66 of drain pillars 98 may effectively block an electric field between gate fingers 102, 104 of gate region 50 and first drain segments 66 of drain pillars 98 to reduce feedback capacitance, Co, between the input to gate region 50 (e.g., first tap interconnect segments 62) and the output from drain region 46 (e.g., first drain segment 66). Further, the reduction in feedback capacitance is effective even though first and second portions 120, 122 of connection structure 118 minimally overlap gate fingers 102, 104.

Figure 5:
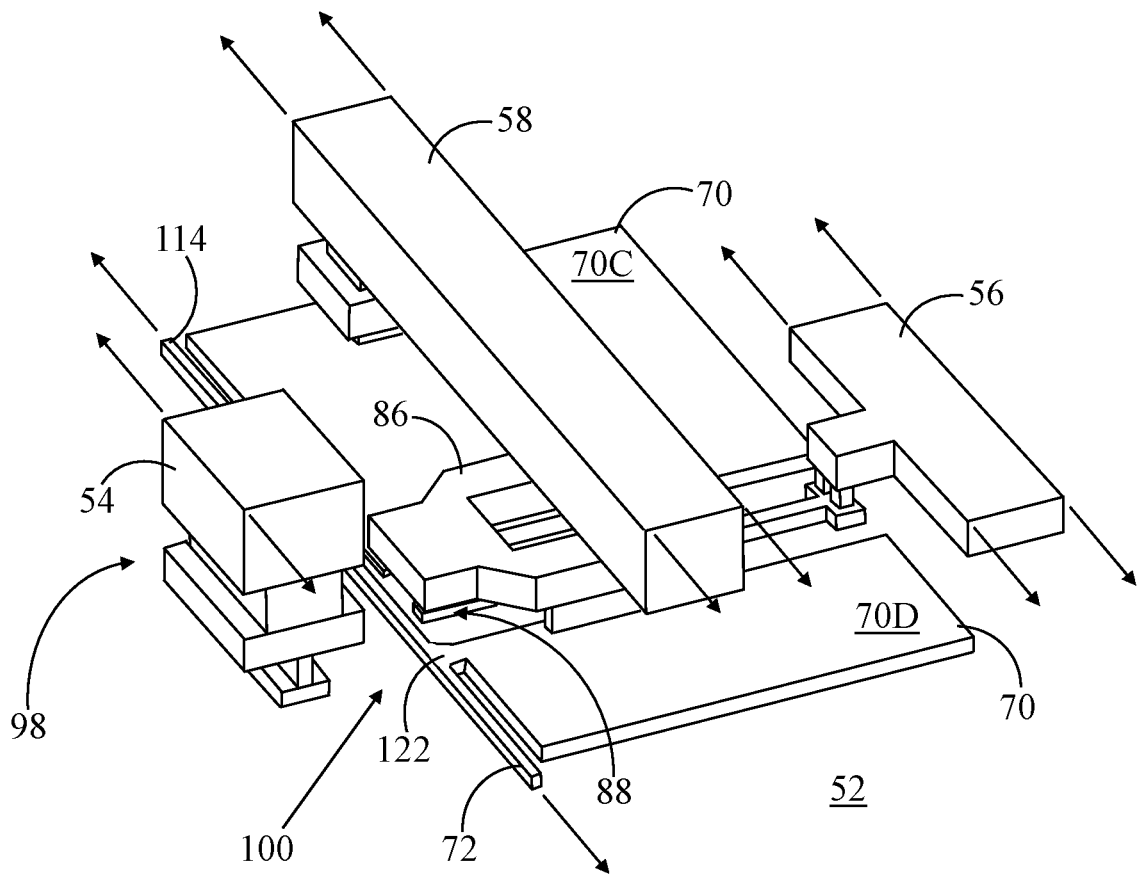
FIG. 5 shows a partial perspective view of an interconnect structure of the transistor of FIG. 2.

FIG. 5 shows a partial perspective view of interconnect structure 52 of transistor 40 (FIG. 2). More particularly, FIG. 5 shows one of tap locations 100 in which tap interconnect 88 is in proximity to drain pillar 94, with first shield trace 114 of first shield structure 72 and second shield structure 86 strategically positioned between drain pillar 98 and tap interconnect 88. The various dielectric material layers surrounding drain pillar 98, first and second shield structures shield structures 72, 86, and tap interconnect 100 are not illustrated in FIG. 5 for clarity. Drain runner 54 is electrically connected to drain pillar 98, gate runner 56 is electrically connected to tap interconnect 88, and shield runner 58 (positioned between drain runner 54 and gate runner 56) is electrically connected to first and second shield structures 72, 86. Each of drain runner 54, gate runner 56, and shield runner 58 are illustrated with arrows pointing in opposing directions to signify that runners 54, 56, 58 extend in a lengthwise direction approximately parallel to one another. Additionally, first shield trace 114 is illustrated with arrows pointing in opposing directions to signify that first shield trace extends longitudinally with and approximately parallel to first gate finger 102 (FIG. 3).

Figure 6:
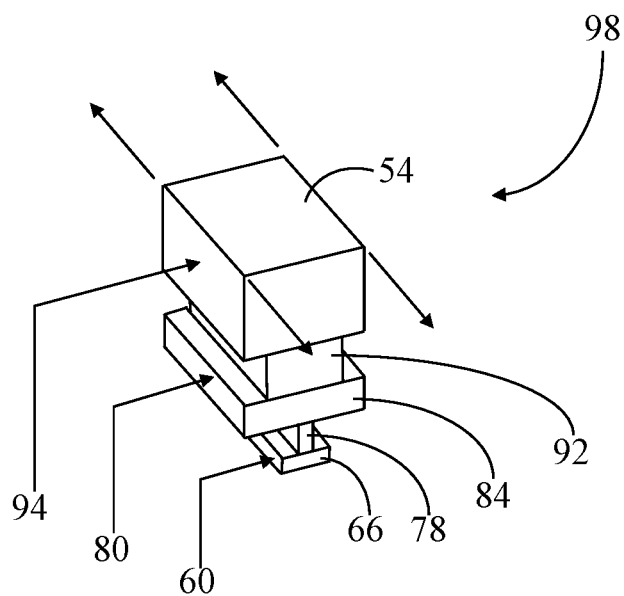
FIG. 6 shows a perspective view of a drain pillar within the interconnect structure.

FIG. 6 shows a perspective view of one of the multiplicity of drain pillars 98 within interconnect structure 52 (FIG. 2). As shown, drain pillar 94 includes first drain segment 66 in first conductive layer 60. Second drain segment 84 in second electrically conductive layer 80 is connected to the underlying first drain segment 66 by conductive via 78. Drain runner 54 in third electrically conductive layer 94 is connected to the underlying second drain segment 84 by conductive via 92.

Figure 7:
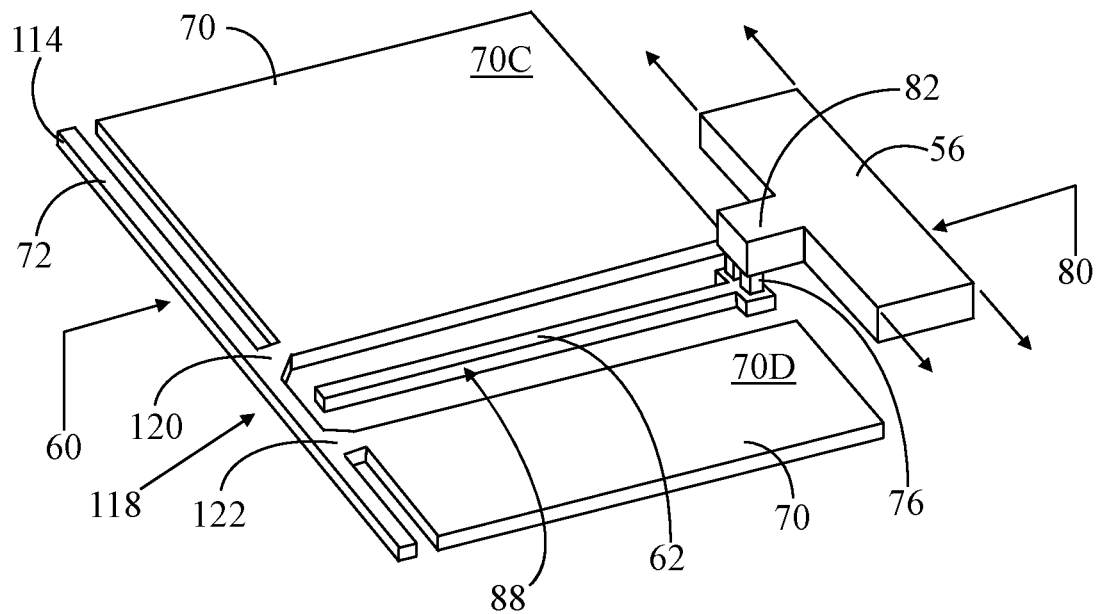
FIG. 7 shows a perspective view of a tap interconnect and a shield structure within the interconnect structure.

FIG. 7 shows a perspective view of a tap interconnect 88 and first shield structure 72 within interconnect structure 52 (FIG. 2). As shown, first tap interconnect segment 62 is formed in first conductive layer 60. However, first tap interconnect segment 62 is laterally spaced apart from and therefore electrically isolated from the surrounding ground plane 70 and first shield structure 72 of first conductive layer 60. In this example, first tap interconnect segment 62 is formed in first conductive layer 60 between sections 70C, 70D of ground plane 70. Second tap interconnect segment 82 (i.e., the gate finger), and therefore gate runner 56 in second conductive layer 80 is connected to the underlying first tap interconnect segment 62 by conductive vias 76.

Figure 8:
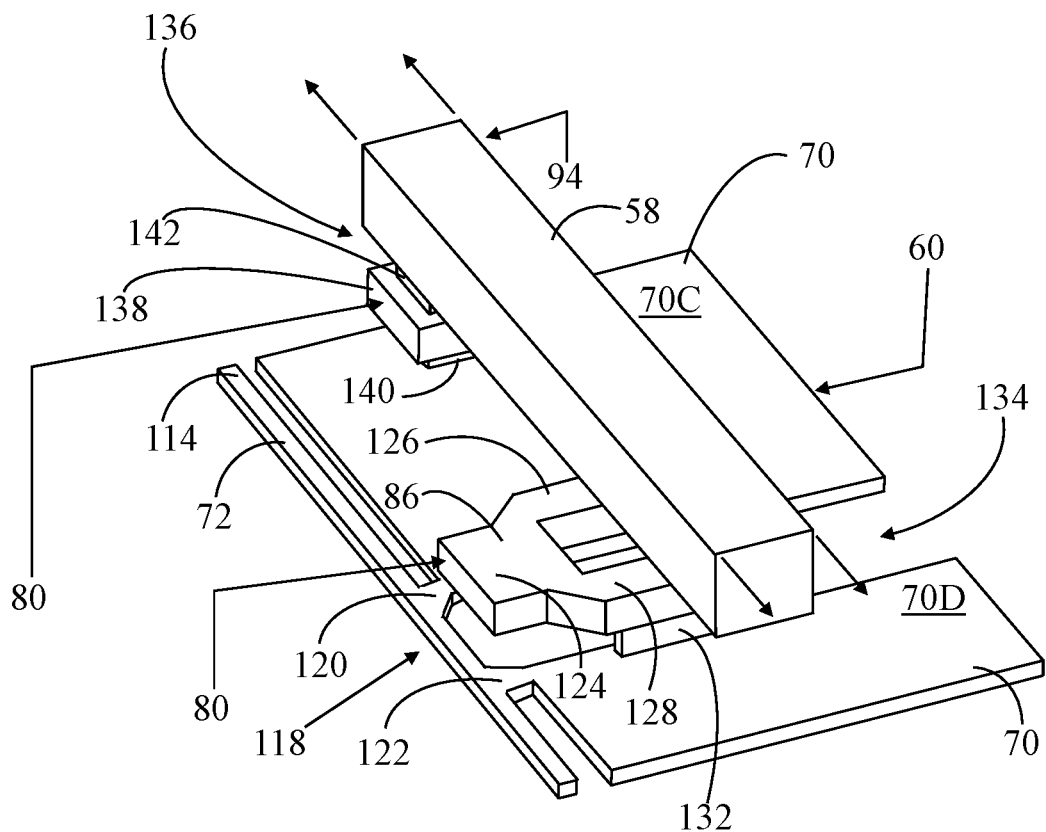
FIG. 8 shows another perspective view of the shield structure, another shield structure, and a shield runner of the interconnect structure.
Figure 9:
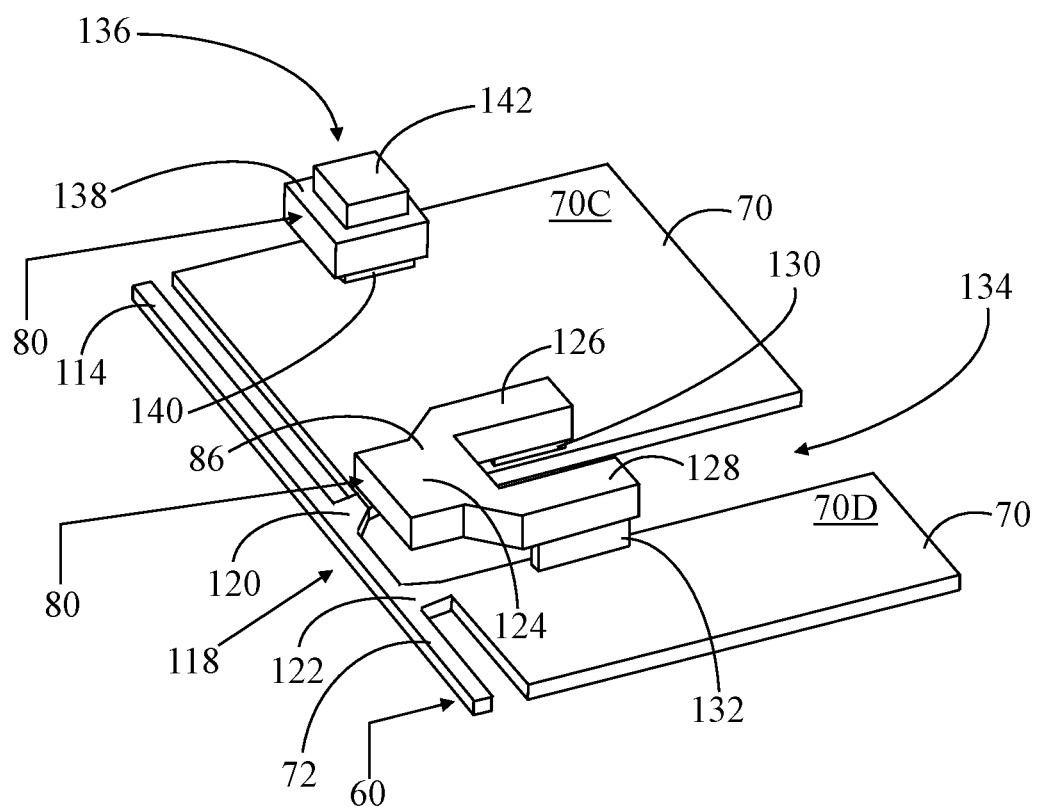
FIG. 9 shows another perspective view of the shield structures with the shield runner removed.

Referring to FIGS. 8 and 9, FIG. 8 shows another perspective view of first shield structure 72, second shield structure 86, and shield runner 58 of interconnect structure 52 (FIG. 2) and FIG. 9 shows another perspective view of first and second shield structures 72, 86 with shield runner 58 removed. As discussed previously, some embodiments may include second shield structure 86 formed in second conductive layer 80 to block an electric field between tap interconnect 88 (FIG. 2) and drain pillars 98 (FIG. 2). Second shield structure 86, formed in second electrically conductive layer 80, includes a base segment 124, a first leg 126, and a second leg 128 in which the first and second legs 126, 128 extend from opposing ends of base segment 124 in a direction that is antiparallel to a length of base segment 124. That is, all of base segment 124, first leg 126, and second leg 128 of second shield structure 86 are formed in second conductive layer 80 to yield second shield structure 86 having an approximately U-shaped or forked geometry.

It should be recalled that ground plane 70 and first shield structure 72 are formed in first conductive layer 60. Second shield structure 86, formed in second conductive layer 80, is vertically spaced apart from sections 70C, 70D of ground plane 70 in this illustrative example. A first electrically conductive via 130 extending through first dielectric material layer 74 (FIG. 2) is coupled to each of first leg 126 and section 70C of ground plane 70. Likewise, a second electrically conductive via 132 extending through first dielectric material layer 74 is coupled to each of second leg 128 and section 70D of ground plane 70. As such, second shield structure 86 bridges across a gap 134 between sections 70C, 70D in which first tap interconnect segment 62 (see FIG. 7) is located. Thus, sections 70C, 70D of ground plane 70 and second shield structure 48 are electrically coupled by first and second vias 130, 132. First tap interconnect segment 62 (FIG. 7) of tap interconnect 88 is positioned in gap 134 between sections 70C, 70D of ground plane 70 and second shield structure 86 overlies the portion of first tap interconnect segment 62 residing closest to drain pillar 98.

Interconnect structure 52 (FIG. 5) may further include one or more shield pillars 136 (one shown in FIGS. 5, 8, and 9) that electrically interconnects shield runner 58 to ground plane 70. A shield segment 138 of shield pillar 136 may be formed in second electrically conductive layer 80. Shield segment 138 is connected to ground plane 70 by one or more electrically conductive vias 140. Additionally, shield segment 138 is interconnected to shield runner 58 by one or more electrically conductive vias 142. Thus, shield pillar 136 extends through first and second dielectric material layers 74, 90 (FIG. 2) and electrically interconnects shield runner 58 with ground plane 70. Shield pillars 136 may be displaced away from second shield structures 86 and hence away from tap locations 100 (FIG. 2). Shield pillars 136 may serve as shunts to ground plane 70 in order to suitably ground first and second shield structures 72, 86. However, shield pillars 136 may be displaced away from tap locations 100 to minimize the potential for input and output capacitance contributions from shield pillars 136. Together, first and second shield structures 72, 86 may more thoroughly block an electric field between drain pillar 98 and tap interconnect 62/gate region 50.

Figure 10:
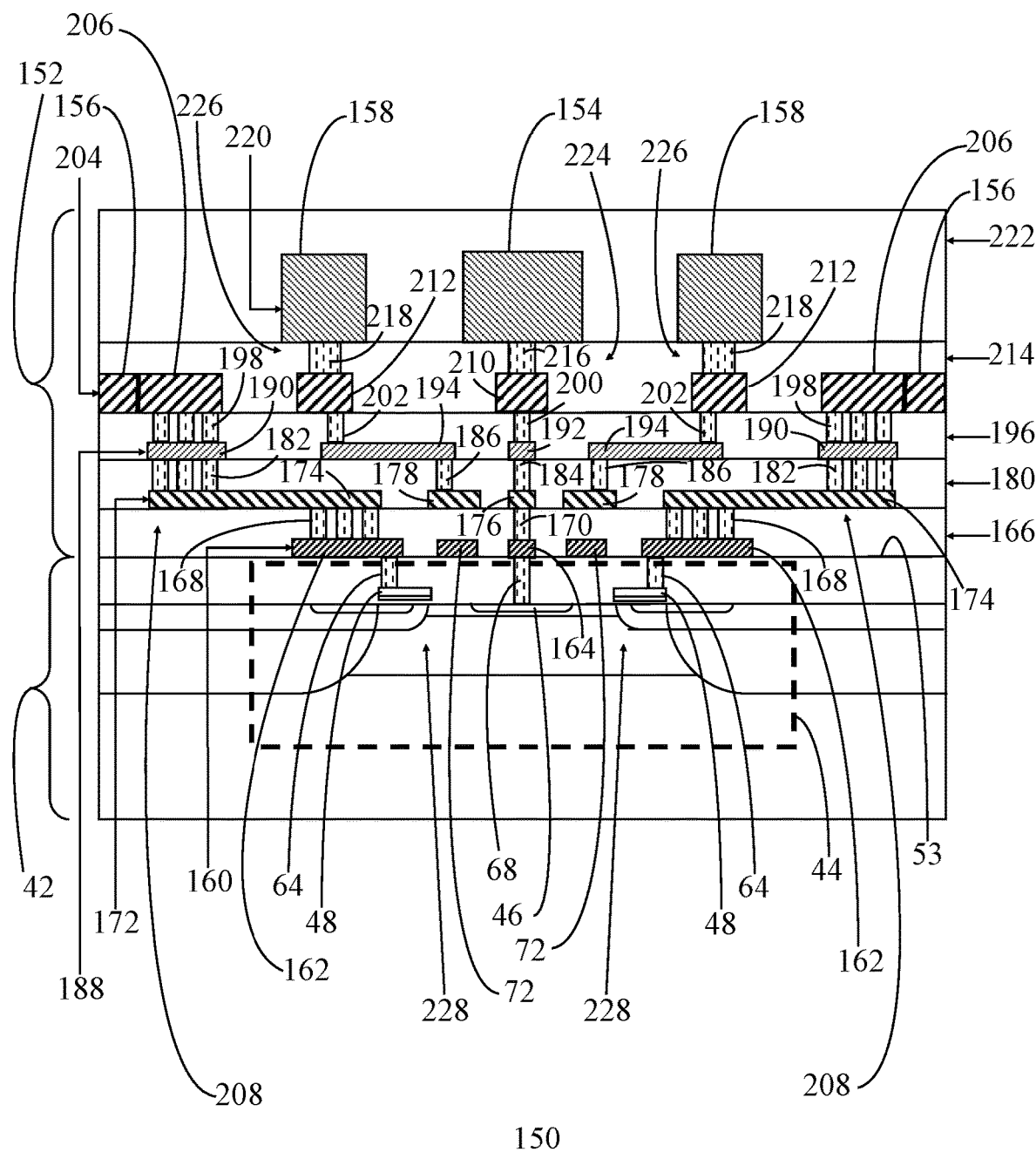
FIG. 10 shows a side sectional view of a portion of a transistor in accordance with another embodiment.

Referring now to FIG. 10, FIG. 10 shows a side sectional view of a portion of a transistor 150 in accordance with another embodiment. As mentioned previously, first shield structure 72 may be alternatively implemented for technologies with more than three metal layers. Transistor 150 provides an example of a configuration that includes five metal layers for illustrative purposes.

Transistor 150 includes semiconductor substrate 42 with intrinsic FET 44, drain region 46, gate electrodes 48 electrically coupled to gate regions 50 of FET 44, and conductive vias 64, 68 as discussed in detail above. An interconnect structure 152 is formed on upper surface 53 of semiconductor substrate 42. In general, interconnect structure 152 of transistor 150 includes a plurality of interdigitated first and second runners, i.e., drain and gate runners 154, 156. Additionally, interconnect structure 152 includes a plurality of shield runners 158 interposed between each drain and gate runner 154, 156. Again, only a single drain runner 154, two gate runners 156, and two shield runners 158 are shown in the side sectional view of FIG. 10 for simplicity of illustration. It should be understood however, that transistor 150 may be configured to include the multiplicity of drain, gate, and shield runners as represented by transistor 20 in FIG. 1.

In the illustrated configuration, a first conductive layer 160 (represented by dark upwardly and rightwardly directed narrow hatching) of interconnect structure 152 is suitably formed on upper surface 53 of semiconductor substrate 42 to include first tap segments 162 (two shown) electrically connected to gate electrodes 48 and thereby to gate regions 50 by way of electrically conductive vias 64, and first drain segments 164 (one shown) electrically connected to drain region 106 by way of an electrically conductive via 125. First conductive layer 160 further includes first shield structure 72 positioned between the bottommost first drain segments 164 and gate region 50 as described in detail above. Of course, other structures may be formed on upper surface 112 of semiconductor substrate 102 that are not illustrated herein for simplicity.

In this example, a first dielectric material layer 166 is formed over first conductive layer 160. Electrically conductive vias 168, 170 may be suitably formed extending through first dielectric layer 166. By way of example, electrically conductive vias 168 extend through first dielectric material layer 166 and are in electrical contact with each of first tap segments 162. Likewise, electrically conductive via 170 extends through first dielectric layer 166 and is in electrical contact with first drain segments 164.

A second electrically conductive layer 172 (represented by downwardly and rightwardly directed wide hatching) is suitably formed on first dielectric material layer 166. Second electrically conductive layer 172 includes tap interconnect segments 174 in electrical contact with conductive vias 168. Second electrically conductive layer 172 further includes a second drain segment 176 in electrical contact with conductive via 170. Still further, second electrically conductive layer 172 includes a shield segment 178 interposed between tap interconnect segments 174 and drain segment 176.

A second dielectric layer 180 is formed over tap interconnect segments 174, drain segment 176, and shield segments 178 of second conductive layer 172. Electrically conductive vias 182, 184, 186 may be suitably formed extending through second dielectric material layer 180. By way of example, one or more electrically conductive vias 182 extend through second dielectric material layer 180 and are in electrical contact with each of tap interconnect segments 174. Likewise, electrically conductive via 184 extends through second dielectric layer 180 and is in electrical contact with drain segment 176. Likewise, electrically conductive vias 186 extend through second dielectric layer 180 and are in electrical contact with each of shield segments 178.

A third electrically conductive layer 188 (represented by rightwardly and upwardly directed narrow hatching) is formed on second dielectric layer 180. Third conductive layer 188 includes tap interconnect segments 190 in electrical contact with conductive vias 182 and a drain segment 192 in electrical contact with conductive via 184. Additionally, third conductive layer 188 includes shield segments 194 interposed between tap interconnect segments 190 and drain segment 192. A third dielectric layer 196 is formed over tap interconnect segments 190, drain segment 192, and shield segments 194 of third conductive layer 188. Electrically conductive vias 198, 200, 202 may be suitably formed extending through third dielectric layer 196. By way of example, one or more electrically conductive vias 198 extend through third dielectric layer 196 and are in electrical contact with each of tap interconnect segments 190. Likewise, electrically conductive via 200 extends through third dielectric layer 196 and is in electrical contact with drain segment 172. Additionally, electrically conductive vias 202 extend through third dielectric material layer 196 and are in electrical contact with each of shield segments 194.

A fourth conductive layer 204 (represented by rightwardly and upwardly directed wide hatching) is formed on third dielectric material layer 196. Gate runners 156 and main gate tap transmission lines 206 extending from gate runners 156 are formed in fourth conductive layer 204. Gate tap transmission lines 206 are in electrical contact with conductive vias 198. Thus, collectively, first tap segment 162, vias 168, tap interconnect segments 174, vias 182, tap interconnect segment 190, vias 198, and gate transmission lines 206 yield individual tap interconnects 208 between first tap segments 162 (and therefore gate region 50) and gate runners 156.

A drain segment 210 is in electrical contact with conductive via 200. Shield segments 212 interposed between gate fingers 206 and drain segment 210 are in electrical contact with conductive vias 202. A fourth dielectric layer 214 is formed over gate transmission lines 206, gate runners 156, drain segment 210, and shield segments 212 of fourth conductive layer 204. In this example, an electrically conductive via 216 may be suitably formed extending through fourth dielectric layer 214 and is in electrical contact with drain segment 210. Similarly, electrically conductive vias 218 may be suitably formed extending through fourth dielectric layer 214 and are in electrical contact with each of shield segments 212.

A fifth electrically conductive layer 220 (represented by rightwardly and downwardly directed narrow hatching) is formed on fourth dielectric layer 214. In this example, drain runner 154 and shield runners 158 are formed in fifth conductive layer 220. Thereafter, a fifth dielectric layer 222 may be formed over drain runner 154 and shield runner 158. Drain runner 154 is in electrical contact with electrically conductive via 216. Thus, collectively, the combination of first drain segment 164, via 170, drain segment 176, via 184, drain segment 192, via 200, drain segment 210, and via 216 yield a drain pillar 224 for transistor 150 that electrically interconnects drain region 46 of intrinsic FET 44 to drain runner 154.

Each of shield runners 158 is in electrical contact with electrically conductive vias 218. Thus, collectively, the combination of one of shield segments 178 connected to conductive vias 186, one of shield segments 194 connected to conductive vias 202, and one of shield segments 212 connected to conductive vias 218 yields a second shield structure 226 (two shown) that is electrically connected to one of shield runners 158.

Second shield structures 226 are laterally spaced apart from and located on opposing sides of drain pillar 184. Each of second shield structures 226 is electrically isolated from drain pillar 224 by dielectric material layers 180, 196, 214, 222. Similarly, second shield structures 226 are laterally spaced apart and are electrically isolated from tap interconnects 208 by dielectric material layers 180, 196, 214, 222. Further, second shield structures 226 extend through dielectric material layers 180, 196, 214 toward upper surface 53 of semiconductor substrate 42. However, second shield structures 226 are vertically spaced apart and electrically isolated from upper surface 53 of semiconductor substrate 42 by first dielectric layer 166. It should be readily observed, however, that each of tap interconnects 208 extends laterally toward drain pillar 224 below their associated shield runner 158 within interconnect structure 150. Like tap interconnects 208, each of second shield structures 226 also extends laterally toward drain pillar 224 in the dielectric material layers 180, 196, 214 so that second shield structures 226 remain positioned between drain pillar 224 and tap interconnects 208.

Gate electrodes 48 of intrinsic FET 44 are driven by an input signal tapped from gate runners 156 via tap interconnects 208 to first tap segments 162 at tap locations 228. Thus, tap locations 228 are the positions where tap interconnects 208 approach drain pillar 224 within interconnect structure 152. Again, the potential for undesirable feedback capacitance, $C_{gd}$, imposed upon the output metallization (i.e., drain pillar 224) from the input metallization (i.e., tap interconnects 208) is greatest at tap locations 228 and along gate fingers 102, 104 (FIG. 3) of gate region 50. First and second shield structures 72, 226 can effectively block an electric field between the input and output to reduce the feedback capacitance.

Transistor 150 provides an example of a five conductive layer (sometimes referred to as a five metal layer) interconnect structure 152 that includes first shield structure 72 in the first conductive layer, and optionally, a second shield structure 226 in the second through fifth conductive layers. However, it should be understood that a wide variety of alternative transistor structures may be envisioned that include at least first shield structure 72 longitudinally aligned with the gate fingers of the gate region of a transistor structure in which the first shield structure 72 is positioned between a segment of a drain pillar and the gate fingers of the gate region.

Figure 11:
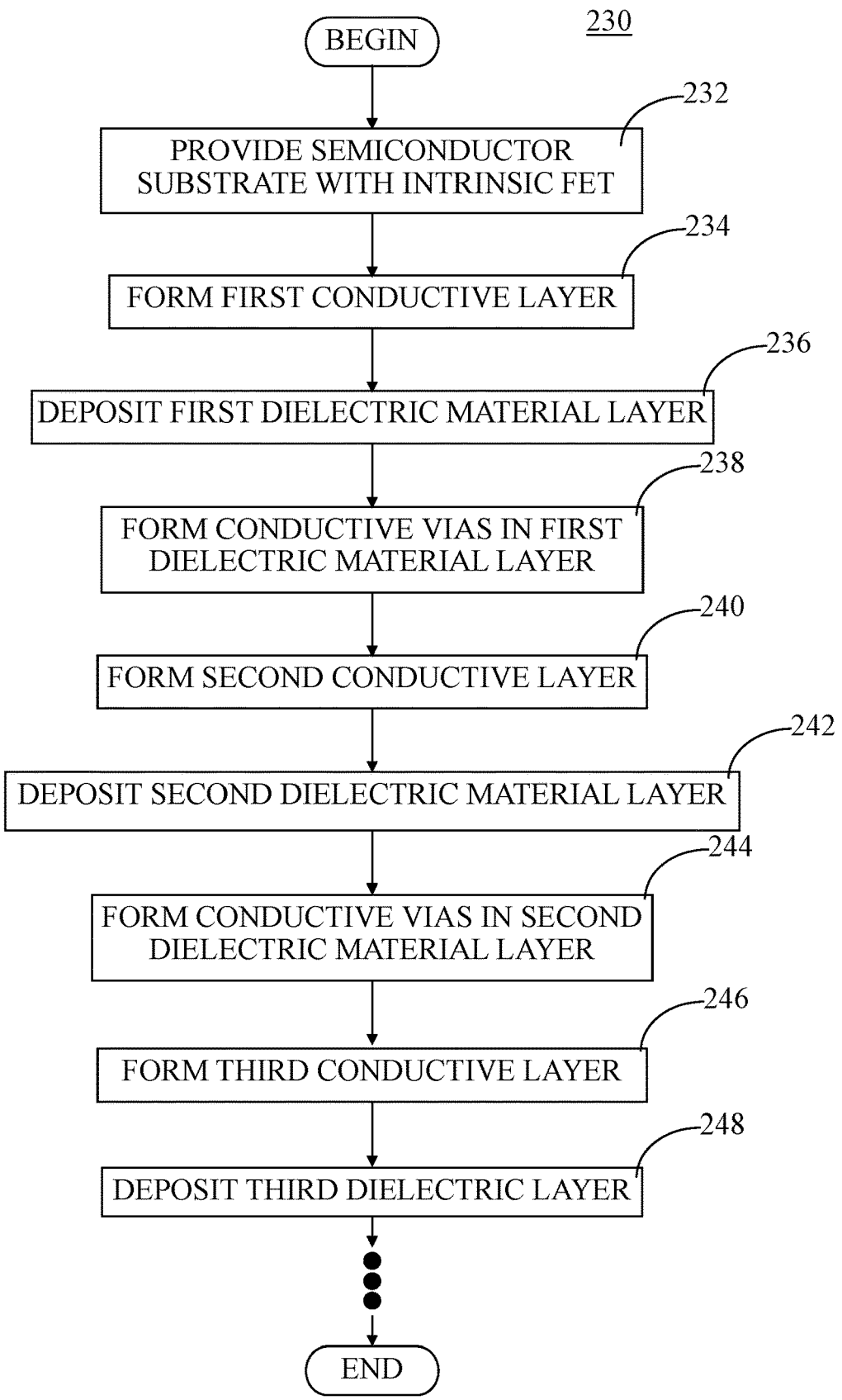
FIG. 11 shows a flowchart of a transistor manufacturing process in accordance with another embodiment.

FIG. 11 shows a flowchart of a transistor manufacturing process 230 in accordance with another embodiment. Transistor manufacturing process 230 may be implemented for fabricating one or more transistors, such as transistor 40 (FIG. 2) having at least first shield structure 72 (FIG. 2) formed therein, and a plurality of second shield structures 86 (FIG. 2) formed therein in some embodiments. For ease of explanation, FIGS. 2-4 should be viewed concurrently along with the ensuing description of transistor manufacturing process 230.

Process 230 may begin in a block 232 by providing a semiconductor substrate (e.g., semiconductor substrate 42) having one or more intrinsic active devices (e.g., FET 44) formed therein. The ensuing blocks 234-248 provide methodology for forming an interconnect structure (e.g., the three metal layer interconnect structure 52) having shield structures (e.g., first and second shield structures 72, 86). In block 234, a first conductive layer (e.g., first electrically conductive layer 60) may be formed on an upper surface (e.g., upper surface 53) of the semiconductor substrate. For example, in block 234, a conductive material such as a metal layer may be suitably deposited, patterned, and etched to yield the desired structures (e.g., first tap interconnect segment 62, ground plane 70, first shield structure 72 having first and second shield traces 114, 116, connection structure 118 electrically coupling first shield structure 72 to ground plane 70, and first drain segment 66) in first conductive layer 60. In a block 236, a dielectric material layer (e.g., first dielectric material layer 74) is deposited over the structures in the bottommost first conductive layer.

In a block 238, electrically conductive vias (e.g., vias 76, 78 of FIG. 2, and vias 130, 132, 140 of FIG. 6) extending through the first dielectric material layer are suitably produced by known and/or upcoming processes. In a block 240, a second conductive layer (e.g., second conductive layer 80) is formed on the first dielectric material layer. For example, in block 240, a conductive material such as a metal layer may be suitably deposited, patterned, and etched to yield the desired structures (e.g., second tap interconnect 82, shield structure 86, gate runner 56, drain segment 84, and shield segment 138 of FIG. 9). In a block 242, a second dielectric material layer (e.g., second dielectric material layer 90) is deposited over the structures in the second conductive layer. In a block 244, a "next" set of electrically conductive vias (e.g., conductive vias 92 of FIG. 2 and conductive vias 142 of FIG. 9) are formed extending through the dielectric material layer.

In a block 246, a third conductive layer (e.g., third conductive layer 94) is formed on the second dielectric material layer. For example, in block 246, a conductive material such as a metal layer may be suitably deposited, patterned, and etched to yield the desired structures (e.g., drain runners 54 and shield runners 58). In a block 248, another dielectric layer (e.g., third dielectric layer 96) is deposited over the structure. Ellipses following block 248 indicate that other tasks may be performed such as the formation of additional electrically conductive and dielectric material layers, testing, incorporating the transistor into a larger electrical system, and so forth.

Accordingly, this process flow continues in the three metal layer configuration shown in FIG. 2 until the three layers of electrically conductive material and dielectric material are suitably processed. Of course, this transistor manufacturing process may be readily adapted for manufacturing a configuration may include more than the three electrically conductive layers and three dielectric material layers shown and discussed herein, with the first shield structure being formed in the first conductive layer and directly coupled by way of a connection structure to the underlying ground plane.

Figure 12:
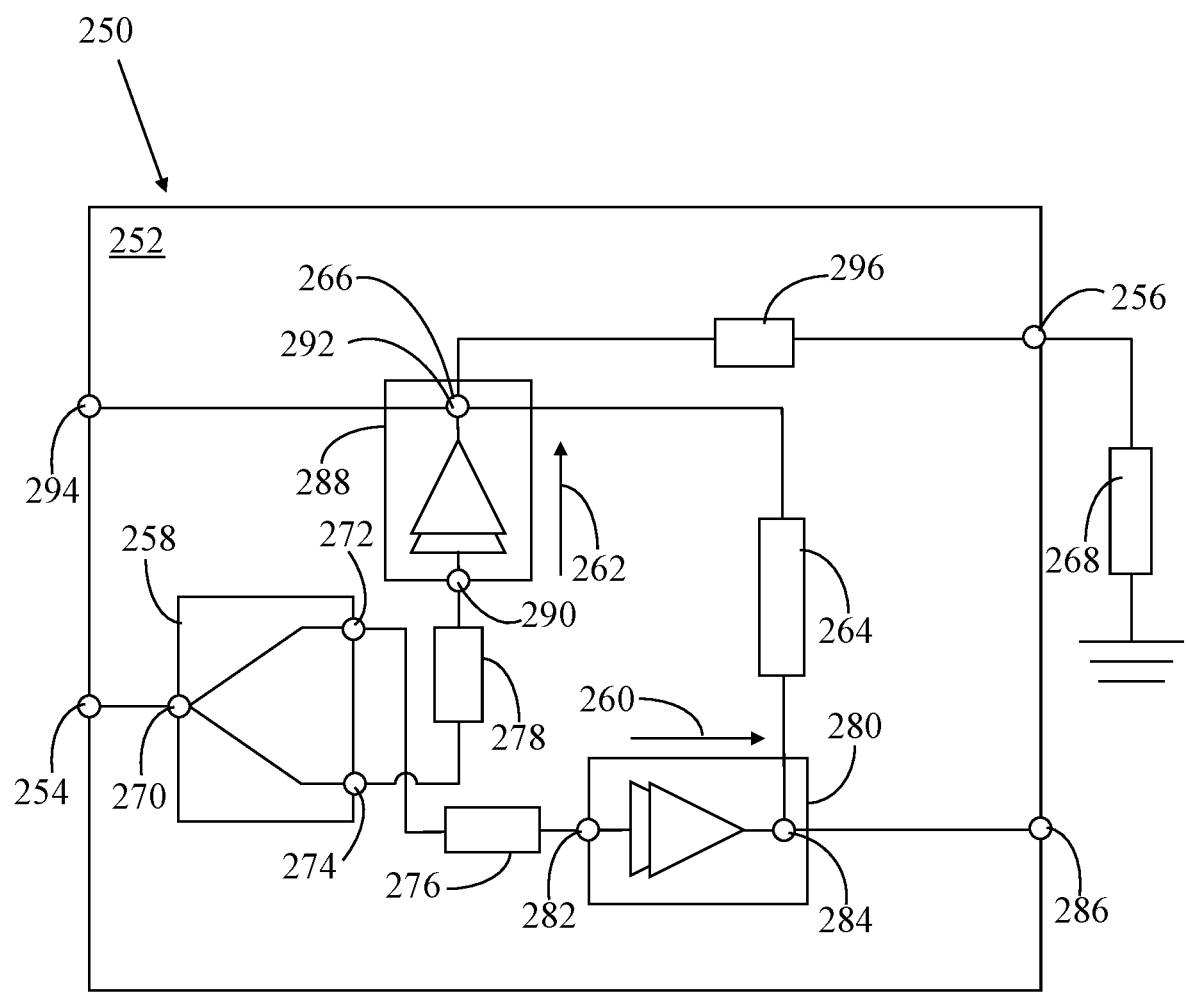
FIG. 12 shows a schematic diagram of an amplifier, in accordance with an example embodiment.

Referring now to FIG. 12, FIG. 12 shows a schematic diagram of a Doherty amplifier 250 in which transistor 40 may be incorporated in accordance with an example embodiment. As indicated in FIG. 12 with box 252, some or all components of Doherty amplifier 100 may be implemented in a single device package or module.

Doherty amplifier 250 includes an RF input node 254, an RF output node 256, a power splitter 258, a carrier amplifier path 260, a peaking amplifier path 262, a phase delay and impedance inversion element 264, and a combining node 266, in an example embodiment. When incorporated into a larger RF system, RF input node 254 is coupled to an RF signal source (not illustrated), and RF output node 256 is coupled to a load 268 (e.g., an antenna or other load). The RF signal source provides an input RF signal, which is an analog signal that includes spectral energy that typically is centered around one or more carrier frequencies. Fundamentally, Doherty amplifier 250 is configured to amplify the input RF signal, and to produce an amplified RF signal at the RF output node 256.

Power splitter 258 has an input 270 and two outputs 272, 274, in an example embodiment. Power splitter input 258 is coupled to the RF input node 254 to receive the input RF signal. Power splitter 258 is configured to divide the RF input signal received at input 270 into first and second RF signals (or carrier and peaking signals), which are provided to the carrier and peaking amplifier paths 260, 262 through outputs 272, 274. Power splitter 258 may include a first phase shift element, which is configured to impart a first phase shift (e.g., about a 90 degree phase shift) to the peaking signal before it is provided to output 274. Accordingly, at outputs 272, 274, the carrier and peaking signals may be about 90 degrees out of phase from each other.

When Doherty amplifier 250 has a symmetrical configuration (i.e., a configuration in which the carrier and peaking amplifier power transistors are substantially identical in size), power splitter 258 may divide or split the input RF signal received at the input 270 into two signals that are very similar with, for example, equal power. Conversely, when Doherty amplifier 250 has an asymmetrical configuration (i.e., a configuration in which one of the amplifier power transistors, typically the peaking amplifier transistor, is significantly larger), power splitter 258 may output signals having unequal power. Power splitter 258 may be implemented with fixed-value, passive components. Alternatively, power splitter 258 may be implemented with one or more controllable variable attenuators and/or variable phase shifters, which enable the power splitter 258 to attenuate and/or phase shift the carrier and peaking signals based on externally-provided control signals.

Outputs 272, 274 of power splitter 258 are connected to the carrier and peaking amplifier paths 260, 262, respectively. As shown in FIG. 12, the connection between output 274 and peaking amplifier path 262 crosses over the connection between output 272 and carrier amplifier path 260. This cross-over configuration may enable compaction and miniaturization of amplifier 250 by enabling a compact arrangement of input circuits 276, 278. In other embodiments, outputs 272, 274 may be reversed, enabling outputs 272, 274 to be connected to carrier and peaking paths 260, 262 without one connection crossing over the other connection.

Carrier amplifier path 260 is configured to amplify the carrier signal from power splitter 258, and to provide the amplified carrier signal to power combining node 266. Similarly, peaking amplifier path 262 is configured to amplify the peaking signal from power splitter 258, and to provide the amplified peaking signal to power combining node 266, where the paths 260, 262 are designed so that the amplified carrier and peaking signals arrive in phase with each other at power combining node 266.

In the illustrated example, carrier amplifier path 260 includes input circuit 276, (e.g., including an impedance matching circuit), a carrier amplifier die 280, and phase delay and impedance inversion element 264. Carrier amplifier die 280 includes an RF input terminal 282, an RF output terminal 284, and one or more amplification stages coupled between the input and output terminals 282, 284, in various embodiments. The RF input terminal 282 is coupled through input circuit 276 to output 272 of power splitter 258, and thus the RF input terminal 282 receives the carrier signal produced by power splitter 258.

Each amplification stage of the carrier amplifier die 280 includes a power transistor. More specifically, each power transistor includes a control terminal (e.g., a gate terminal) and first and second current-carrying terminals (e.g., a drain terminal and a source terminal). In a single-stage device, which would include a single power transistor, the control terminal is electrically connected to RF input terminal 282, one of the current-carrying terminals (e.g., the drain terminal or the source terminal) is electrically connected to RF output terminal 284, and the other current-carrying terminal (e.g., the source terminal or the drain terminal) is electrically connected to a ground reference (or another voltage reference). Conversely, a two-stage device would include two power transistors coupled in series, where a first transistor functions as a driver amplifier transistor and a second transistor functions as an output amplifier transistor. In such an embodiment, the control terminal of the driver amplifier transistor is electrically connected to the RF input terminal 282, one of the current-carrying terminals of the driver amplifier transistor (e.g., the drain terminal or the source terminal) is electrically connected to the control terminal of the output amplifier transistor, and the other current-carrying terminal of the driver amplifier transistor (e.g., the source terminal or the drain terminal) is electrically connected to the ground reference (or another voltage reference). Additionally, one of the current-carrying terminals of the output amplifier transistor (e.g., the drain terminal or the source terminal) is electrically connected to the RF output terminal 284, and the other current-carrying terminal of the output amplifier transistor (e.g., the source terminal or the drain terminal) is electrically connected to the ground reference (or another voltage reference).

In accordance with some embodiments, transistor 40 (FIG. 2), transistor 150 (FIG. 10), or any other transistor configuration having first shield structure 72 formed in the first conductive layer (e.g., the metal 1 layer) may be implemented as the power transistor(s) of carrier amplifier die 280.

RF output terminal 284 of carrier amplifier die 280 is coupled to power combining node 266 through phase shift and impedance inversion element 264, in an example embodiment. According to some configurations, the impedance inversion element is a lambda/4 ($\lambda/4$) transmission line phase shift element (e.g., a microstrip line), which imparts about a 90 degree relative phase shift to the carrier signal after amplification by carrier amplifier die 280. In addition, a drain bias voltage terminal 286 may be coupled to an external bias circuit (not shown) for providing a DC bias voltage to RF output terminal 284 of carrier amplifier die 280. A first end of the impedance inversion element 264 is also coupled to the RF output terminal 284 of carrier amplifier die 280, and a second end of phase shift element 264 is coupled to power combining node 266.

Reference is now made to peaking amplifier path 262, which includes a peaking amplifier die 288 and input circuit 278 (e.g., including an impedance matching circuit), in an example embodiment. Peaking amplifier die 288 includes an RF input terminal 290, an RF output terminal 292, and one or more amplification stages coupled between the input and output terminals 290, 292. RF input terminal 290 is coupled to output 274 of power splitter 258, and thus RF input terminal 290 receives the peaking signal produced by power splitter 258.

As with the carrier amplifier die 280, each amplification stage of peaking amplifier die 288 includes a power transistor with a control terminal and first and second current-carrying terminals. Again, the power transistor may be transistor 40 (FIG. 2), transistor 150 (FIG. 10), or any other transistor configuration having first shield structure 72 formed in the first conductive layer (e.g., the metal 1 layer). The power transistor(s) of the peaking amplifier die 288 may be electrically coupled between the RF input and output terminals 290, 292 in a manner similar to that described above in conjunction with the description of carrier amplifier die 280. Additional other details discussed with in conjunction with the description of carrier amplifier die 280 also apply to peaking amplifier die 288, and those additional details are not reiterated here for brevity.

RF output terminal 292 of the peaking amplifier die 286 is coupled to power combining node 266. According to an example, RF output terminal 292 of peaking amplifier die 288 and combining node 266 are implemented with a common element. For example, RF output terminal 292 of peaking amplifier die 288 may be configured to function both as combining node 266 and as RF output terminal 292 of peaking amplifier die 286. In addition, a drain bias voltage terminal 294 may be coupled to an external bias circuit (not shown) for providing a DC bias voltage to RF output terminal 292 of peaking amplifier die 288. Still further, RF output terminal 292 may be configured to enable a connection between the second end of phase shift and impedance inversion element 264 and peaking amplifier die 288 (e.g., implemented with a wirebond array) to extend in a direction that is angularly offset from (e.g., perpendicular to) the direction of the input signal to peaking amplifier die 288 (e.g., as indicated with arrow 262). This may be accomplished, for example, by providing an elongated RF input terminal 288 (e.g., gate terminal) that is angularly offset from (e.g., perpendicular to) an elongated portion of RF output terminal 290 (e.g., drain terminal) to which phase shift element 264 is coupled.

The amplified carrier and peaking RF signals combine in phase at combining node 266 and combining node 266 is electrically coupled to the RF output node 256 to provide the amplified and combined RF output signal to the RF output node 256. In an example embodiment, an output impedance matching network 296 between combining node 266 and the RF output node 256 functions to present proper load impedances to each of the carrier and peaking amplifier die 280, 288. The resulting amplified RF output signal is produced at RF output node 256, to which output load 268 (e.g., an antenna) is connected.

Amplifier 250 is configured so that carrier amplifier path 260 provides amplification for relatively low level input signals, and both amplification paths 260, 262 operate in combination to provide amplification for relatively high level input signals. This may be accomplished, for example, by biasing carrier amplifier die 280 so that the carrier amplifier die 280 operates in a class AB mode, and biasing peaking amplifier die 288 so that peaking amplifier die 288 operates in a class C mode.

In the example illustrated in FIG. 12 and described above, a first phase shift element in splitter 258 imparts about 90 degrees of phase shift to the peaking signal prior to amplification, and phase shift and impedance inversion element 264 similarly imparts about 90 degrees of phase shift to the amplified carrier signal so that the amplified carrier and peaking signals may combine in phase at combining node 266. Such an architecture is referred to as a non-inverted Doherty amplifier architecture. In another example, a first phase shift element in splitter 258 may impart about 90 degrees of phase shift to the carrier signal prior to amplification, rather than to the peaking signal, and phase shift and impedance inversion element 264 may be included instead at the output of the peaking amplifier. Such an alternate architecture is referred to as an inverted Doherty amplifier architecture. In still other examples, other combinations of phase shift elements may be implemented in the carrier and/or peaking paths 260, 262 prior to amplification to achieve about 90 degrees of phase difference between the carrier and peaking signals prior to amplification, and the phase shifts applied to the amplified carrier and peaking signals may be selected accordingly to ensure that the signals combine in phase at combining node 266. For example, phase shifts greater than 90 degrees may be applied along carrier and peaking paths 260, 262.

Figure 13:
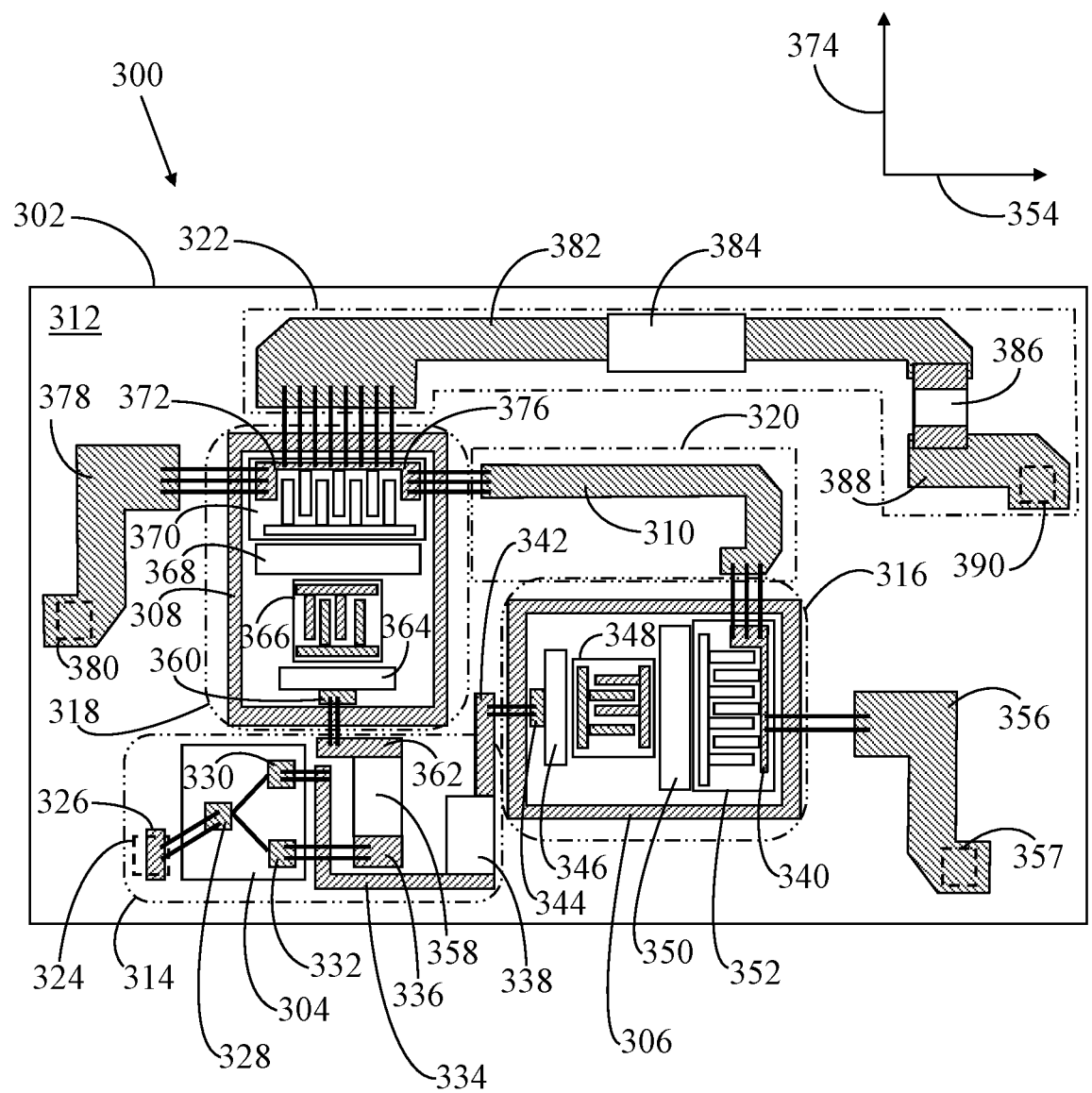
FIG. 13 shows a top view of an amplifier module, in accordance with an example embodiment.

An example of a physical implementation of the Doherty amplifier circuit of FIG. 12 now will be described in detail in conjunction with FIG. 13. More specifically, FIG. 13 shows a top view of a Doherty amplifier module 300, in accordance with an example configuration.

Doherty amplifier module 300 includes a substrate 302, a power splitter 304 (e.g., power splitter 258, FIG. 12), a carrier amplifier die 306 (e.g., carrier amplifier die 280, FIG. 12), a peaking amplifier die 308 (e.g., peaking amplifier die 288, FIG. 12), a phase shift and impedance inversion element 310 (e.g., phase shift and impedance inversion element 264, FIG. 12), and various other circuit elements, which will be discussed in more detail below. Doherty amplifier module 300 may be implemented as a land grid array (LGA) module, for example. Accordingly, substrate 302 has a component mounting surface 312 and a land surface (not shown) opposite component mounting surface 312. Component mounting surface 312 and the components mounted to that surface 312 optionally may be covered with an encapsulant material (not shown). Alternatively, the components could be contained within an air cavity, which is defined by various structures (not illustrated) overlying mounting surface 312.

A plurality of non-overlapping zones are defined at the mounting surface 312 of substrate 302. More specifically, the non-overlapping zones may include an input signal and splitter zone 314, a first-die mounting zone 316, a second-die mounting zone 318, an inter-amplifier impedance inverter zone 320, and an output match zone 322. Within input signal and splitter zone 314, a conductive landing pad 324 (represented by a dashed line box) exposed at the land surface is electrically coupled through substrate 302 to a conductive contact 326 at the mounting surface 312. Landing pad 324 and contact 326, along with the electrical connections between them, function as the RF input node (e.g., RF input node 254, FIG. 12) for module 300.

Power splitter 304 is coupled to mounting surface 312 in input signal and splitter zone 314. Power splitter 304 may include one or more discrete die and/or components, although it is represented in FIG. 13 as a single element. Power splitter 304 includes an input terminal 328 (e.g., input 270, FIG. 12) and two output terminals 330, 332 (e.g., outputs 272, 274, FIG. 12). Input terminal 328 is electrically coupled (e.g., through wirebonds, as shown) to conductive contact 326 to receive an input RF signal. In addition, output terminals 330, 332 are electrically coupled (e.g., through additional wirebonds, as shown) to conductive contacts 334, 336 at the mounting surface 312. Power splitter 304 is configured to split the power of the input RF signal received through input terminal 328 into first and second RF signals (e.g., carrier and peaking signals), which are produced at the output terminals 330, 332. In addition, power splitter 304 may include a first phase shift element configured to impart about a 90 degree phase shift to the RF signal provided at output terminal 332. Power splitter 304 may consist of fixed-value, passive components or power splitter 304 may include variable phase shifters and/or attenuators.

The first and second RF signals may have equal or unequal power, as discussed previously. The first RF signal produced at output terminal 330 and conveyed to conductive contact 334 is amplified through a carrier amplifier path. The carrier amplifier path includes an input circuit 338 (e.g., input circuit 276, FIG. 12) mounted within the input signal and splitter zone 320, carrier amplifier die 306 (e.g., die 280, FIG. 12) mounted within first-die mounting zone 316, phase shift and impedance inversion element 210 (e.g., impedance inversion element 264, FIG. 12) connected to the substrate 302 within the inter-amplifier impedance inverter zone 320 and connected to an RF output terminal 340 of carrier amplifier die 306.

Input circuit 338 is electrically connected between conductive contacts 334 and 342. Although the detail is not shown in FIG. 13, input circuit 338 may include a plurality of discrete and/or integrated components (e.g., inductors and capacitors) configured to provide proper impedance matching between the first power splitter output 330 and the input to carrier amplifier die 306.

Conductive contact 342 is electrically coupled (e.g., with wirebonds) to an RF input terminal 344 of the carrier amplifier die 306, in order to provide an RF carrier signal for amplification to the carrier amplifier die 306. The illustrated embodiment of carrier amplifier die 306 embodies a two-stage amplifier. More specifically, the electrical components of carrier amplifier die 306 include RF input terminal 344, an input matching network 346, a driver transistor 348, an interstage matching network 350, an output transistor 352, and RF output terminal 340. Driver and output transistors 348, 352 are coupled in series between RF input and output terminals 344, 340. Driver transistor 348 is configured to apply a relatively low gain to the carrier signal, and output transistor 352 is configured to apply a relatively high gain to the carrier signal after preliminary amplification by driver transistor 348. In other embodiments, the carrier amplifier die 306 may embody a single stage amplifier, or may include more than two amplification stages.

Each of the transistors 348, 352 may be a field effect transistor (FET) (such as a metal oxide semiconductor FET (MOSFET), a laterally diffused MOSFET (LDMOS FET), a high electron mobility transistor (HEMT), and so on). Alternatively, each of the transistors 335, 337 may be a bipolar junction transistor (BJT). More particularly, and in accordance with an embodiment, transistor 40 (FIG. 2), transistor 150 (FIG. 10), or any other suitable transistor that incorporates first shield structure 72 (FIG. 2) may be implemented for driver and output transistors 348, 352.

RF input terminal 344 of carrier amplifier die 306 is electrically coupled to the gate terminal of driver transistor 348 through input matching network 346, and the drain terminal of transistor 348 is electrically coupled to the gate terminal of output transistor 352 through interstage matching network 350. The drain terminal of output transistor 352 may be electrically coupled to RF output terminal 340. Accordingly, the signal path through carrier amplifier die 306 is in a direction extending from the RF input terminal 344 toward RF output terminal 340, which direction is indicated by an arrow 354.

An amplified RF carrier signal is produced by the carrier amplifier die 306 at RF output terminal 340. In the illustrated example, the RF output terminal 340 is electrically coupled to a first end of phase shift and impedance inversion element 310, which is at least partially exposed at the mounting surface 312, with a plurality of parallel, closely spaced wirebonds. In addition, a drain bias voltage terminal 356 may be coupled to an external bias circuit (not shown) that is electrically connected through substrate 302 to a landing pad 357 (represented by a dashed line box) for providing a DC bias voltage to RF output terminal 340 of carrier amplifier die 306 (e.g., the drain terminal), as discussed in connection with FIG. 12. RF output terminal 340 of carrier amplifier die 306 includes an elongated first pad that is configured to enable wirebonds to be connected to the first pad so that the wirebonds extend in a direction that is angularly offset from (e.g., perpendicular to) the direction of the signal path 354 through the carrier amplifier die 306.

Through the wirebond array, the RF output terminal 340 is electrically coupled to phase shift and impedance inversion element 310, which is located in the inter-amplifier impedance inverter zone 320. Phase shift and impedance inversion element 310 may be implemented with a transmission line (e.g., a microstrip line) having an electrical length of about lambda/4 ($\lambda/4$) or less. The transmission line has a first end that is proximate to the carrier amplifier die 306 and a second end that is proximate to peaking amplifier die 308. Phase shift and impedance inversion element 310 may be formed from a portion of one or more of the metal layers of the module substrate 302 and/or may be formed on a surface of the module substrate 302.

Moving back to power splitter 304 in the input signal and splitter zone 314, the second RF signal (i.e., the peaking signal) produced at output terminal 332 of power splitter 304 and conveyed to conductive contact 336 is amplified through a peaking amplifier path. The peaking amplifier path includes an input circuit 358 within the input signal and splitter zone 314 and peaking amplifier die 308 (e.g., die 288, FIG. 12) mounted within second-die mounting zone 318. As mentioned above, power splitter 304 may impart about a 90 degree phase shift to the RF signal provided at output terminal 332. Accordingly, the phase of the peaking signal received at an RF input terminal 360 of peaking amplifier die 308 may be delayed by about 90 degrees with respect to the carrier signal received at RF input terminal 344 of carrier amplifier die 306.

Input circuit 358 is electrically connected between conductive contacts 334 and 362. Although the detail is not shown in FIG. 13, input circuit 358 may include a plurality of discrete and/or integrated components (e.g., inductors and capacitors) configured to provide proper impedance matching between the second power splitter output 332 and the input to the peaking amplifier die 308. Conductive contact 362 is electrically coupled (e.g., with wirebonds) to RF input terminal 360 of peaking amplifier die 308, in order to provide an RF carrier signal for amplification to peaking amplifier die 308. The illustrated example of peaking amplifier die 308 also embodies a two-stage amplifier. More specifically, the electrical components of peaking amplifier die 308 include RF input terminal 360, an input matching network 364, a driver transistor 366, an interstage matching network 368, an output transistor 370, and an RF output terminal 372. The driver and output transistors 366, 370 are coupled in series between the RF input and output terminals 360, 372. In other configurations, peaking amplifier die 308 may embody a single stage amplifier, or may include more than two amplification stages. Again, each of the transistors 366, 370 may be transistor 40 (FIG. 2), transistor 150 (FIG. 10), or any other transistor configuration having at least first shield structure 72 implemented therein for reducing feedback capacitance between the gate and drain.

RF input terminal 360 of peaking amplifier die 308 is electrically coupled to the gate terminal of driver transistor 366 through input matching network 364, and the drain terminal of driver transistor 366 is electrically coupled to the gate terminal of output transistor 370 through inter-stage matching network 368. The drain terminal of output transistor 370 may be electrically coupled to RF output terminal 372. Accordingly, the signal path through the peaking amplifier die 308 is in a direction extending from RF input terminal 360 toward RF output terminal 372, which direction is indicated by an arrow 374.

An amplified RF peaking signal is produced by the peaking amplifier die 308 at RF output terminal 372. As mentioned above, RF output terminal 372 may be electrically coupled to impedance inversion element 310 with a wirebond array, and RF output terminal 372 functions as a combining node 376 (e.g., combining node 266, FIG. 12) at which the amplified and delayed carrier amplifier signal is combined, in phase, with an amplified peaking amplifier signal. In addition, a drain bias voltage terminal 378 may be coupled to an external bias circuit (not shown) that is electrically connected through substrate 302 to a landing pad 380 (represented by a dashed line box) for providing a DC bias voltage to RF output terminal 372 of peaking amplifier die 308 (e.g., the drain terminal), as discussed in connection with FIG. 12.

Except for the configurations of the RF output terminals 340, 372, peaking amplifier die 308 may be structurally identical to carrier amplifier die 306, meaning that the two dies 306, 308 include the same structural and electrical elements arranged and interconnected in the same manner.

Further, peaking amplifier die 308 and carrier amplifier die 306 may also be identical in size, rendering the Doherty amplifier module 300 a symmetric Doherty amplifier. In another example, peaking amplifier die 308 and carrier amplifier die 306 may have different sizes, the rendering the Doherty amplifier module 300 an asymmetric Doherty amplifier.

Through a wirebond array, the RF output terminal 372 is electrically coupled to phase shift and impedance inversion element 310. Accordingly, the amplified carrier signal produced by the carrier amplifier die 306 is received at the RF output terminal 372 of peaking amplifier die 308 through a wirebond array, phase shift and impedance inversion element 310, and another wirebond array. The amplified peaking signal produced by the peaking amplifier die 308 also is received at RF output terminal 372, and the module 300 is configured so that the amplified carrier and peaking signals arrive and are combined at RF output terminal 372 (or combining node 376) in phase with each other.

RF output terminal 372 (or combining node 376) is electrically coupled to a conductive output trace 382 at mounting surface 312 with a wirebond array. An output impedance matching network 384 and/or a decoupling capacitor 386 may be coupled along output trace 382. Output impedance matching network 384 functions to present the proper load impedance to combining node 376. Although the detail is not shown in FIG. 13, the output impedance matching network 384 may include various discrete and/or integrated components (e.g., capacitors, inductors, and/or resistors) to provide the desired impedance matching. Output impedance matching network 384 is electrically coupled to a conductive contact 388 at mounting surface 312. Conductive contact 388 is in electrical contact with a landing pad 390 exposed at the land surface of substrate 302. Landing pad 390 and contact 388, along with the electrical connections between them, function as the RF output node (e.g., RF output node 256, FIG. 12) for module 300.

The above described embodiment includes two-way Doherty power amplifier implementation, which includes a carrier amplifier and a peaking amplifier. According to other embodiments, a Doherty power amplifier may include more than one peaking amplifier, or module 300 may be modified to implement types of amplifiers other than Doherty amplifiers. That is, various modifications may be made to module 300 while still including transistors that have first shield structure 72 (FIG. 2) in the first metal layer (e.g., first conductive layer) of the interconnect structure, as described in detail above.

Further, although embodiments have been described herein with respect to a Doherty power amplifier, those of skill in the art would understand, based on the description herein, that embodiments of the inventive subject matter may be used in conjunction with virtually any type of multiple path amplifier. Accordingly, the transistor having the shield structures described herein is not limited to use with Doherty amplifiers, nor are the shield structures limited to use with amplifiers having only two amplification paths. Rather, the transistor may be implemented within a wide variety of circuits.

Embodiments described herein entail a transistor having a shield structure within an interconnect structure of the transistor, an amplifier module having such a transistor, and a method of manufacturing the transistor. An embodiment of a transistor comprises a semiconductor substrate having a first terminal and a gate region, and an interconnect structure on an upper surface of the semiconductor substrate. The interconnect structure is formed of multiple layers of dielectric material and electrically conductive material, the electrically conductive material including at least a first layer and a second layer spaced apart from the first layer by a first dielectric layer of the dielectric material, and the first layer residing closest to the upper surface of the semiconductor substrate relative to the second layer. The interconnect structure comprises a pillar formed from the electrically conductive material, the pillar being in electrical contact with the first terminal, the pillar extending through the dielectric material, the pillar including a pillar segment in the first layer of the electrically conductive material, and the interconnect structure comprises a shield structure in the first layer of the electrically conductive material and positioned between the pillar segment and the gate region.

An embodiment of an amplifier module comprises a substrate with a mounting surface and a transistor coupled to the mounting surface of the substrate. The transistor includes a semiconductor substrate having a first terminal and a gate region, and an interconnect structure on an upper surface of the semiconductor substrate. The interconnect structure is formed of multiple layers of dielectric material and electrically conductive material, the electrically conductive material including at least a first layer and a second layer spaced apart from the first layer by a first dielectric layer of the dielectric material, and the first layer residing closest to the upper surface of the semiconductor substrate relative to the second layer. The interconnect structure includes a pillar formed from the electrically conductive material, the pillar being in electrical contact with the first terminal, the pillar extending through the dielectric material, the pillar including a pillar segment in the first layer of the electrically conductive material, and the interconnect structure includes a shield structure in the first layer of the electrically conductive material and positioned between the pillar segment and the gate region.

An embodiment of method of manufacturing a transistor comprising providing a semiconductor substrate having a first terminal and a gate region, and forming an interconnect structure on an upper surface of the semiconductor substrate of multiple layers of dielectric material and electrically conductive material. Forming the interconnect structure comprises forming a pillar from the electrically conductive material, the pillar electrically contacting the first terminal, the pillar extending through the dielectric material, wherein the forming the pillar includes forming a first pillar segment in a first layer of the electrically conductive material, the first layer residing closest to the upper surface of the semiconductor substrate without an intervening layer of the electrically conductive material. Forming the interconnect structure further comprises forming a shield structure in the first layer of the electrically conductive material and positioned between the pillar segment and the gate region.

Accordingly, embodiments can include a shield structure formed in a first conductive layer, sometimes referred to as an M1 layer, of an interconnect structure, in which the first conductive layer resides closest to a top surface of the transistor without an intervening electrically conductive layer. The shield structure can include shield traces that are positioned between the gate fingers and the drain of the transistor. The shield traces may be longitudinally aligned with the length of the gate fingers. The shield structure is configured to block electric fields between the input signal tapped from a runner and the output signal carried to another runner of the transistor. The geometry of the shield structure is configured to be small to minimize additional input and output capacitance contributions from the shield structure, and to enable reductions in die size for module applications. The geometry of the shield structure reduces feedback capacitance and thereby improves the gain, contour alignment, and stability of the active device (e.g., transistor).

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A transistor comprising:
    a semiconductor substrate having a first terminal and a gate region;
    an interconnect structure on an upper surface of the semiconductor substrate, the interconnect structure being formed of multiple layers of dielectric material and electrically conductive material, the electrically conductive material including at least a first layer and a second layer spaced apart from the first layer by a first dielectric layer of the dielectric material, the first layer residing closest to the upper surface of the semiconductor substrate relative to the second layer, and the interconnect structure comprising:
        a pillar formed from the electrically conductive material, the pillar being in electrical contact with the first terminal, the pillar extending through the dielectric material, the pillar including a pillar segment in the first layer of the electrically conductive material; and
        a shield structure in the first layer of the electrically conductive material and positioned between the pillar segment and the gate region; and
    a ground plane formed in the first layer of the interconnect structure, wherein the shield structure is electrically connected to the ground plane.

2. The transistor of claim 1 wherein the shield structure is coupled with the upper surface of the semiconductor substrate without an intervening layer of the electrically conductive material.

3. The transistor of claim 1 wherein the shield structure is electrically isolated from the pillar and the gate region.

4. The transistor of claim 1 further comprising a connection structure formed in the first layer and overlapping the gate region, the connection structure interconnecting the shield structure with the ground plane, and the shield structure, connection structure, and ground plane being electrically isolated from the gate region.

5. The transistor of claim 1 further comprising:
    a shield runner formed in the interconnect structure; and
    a shield pillar extending through the interconnect structure and electrically interconnecting the shield structure and the ground plane with the shield runner.

6. The transistor of claim 1 wherein:
    the gate region includes a first gate finger characterized by a length;
    the interconnect structure further comprises a plurality of pillars aligned with the length of the gate finger, the pillar being one of the plurality of pillars, each of the plurality of pillars including the pillar segment in the first layer of the electrically conductive material; and
    the shield structure includes a first shield trace longitudinally aligned with the length of the first gate finger and positioned between the first gate finger and a first side of the plurality of pillars.

7. The transistor of claim 6 wherein:
    the gate region further includes a second gate finger characterized by the length; and
    the shield structure further includes a second shield trace longitudinally aligned with the length of the second gate finger and positioned between the second gate finger and a second side of the plurality of pillars.

8. The transistor of claim 6 wherein each of the plurality of pillars is coupled to a drain runner formed in the interconnect structure.

9. The transistor of claim 1 wherein the shield structure is configured to block an electric field between the gate region and the pillar.

10. A transistor comprising:
    a semiconductor substrate having a first terminal and a gate region; and
    an interconnect structure on an upper surface of the semiconductor substrate, the interconnect structure being formed of multiple layers of dielectric material and electrically conductive material, the electrically conductive material including at least a first layer and a second layer spaced apart from the first layer by a first dielectric layer of the dielectric material, the first layer residing closest to the upper surface of the semiconductor substrate relative to the second layer, and the interconnect structure comprising:
        a pillar formed from the electrically conductive material, the pillar being in electrical contact with the first terminal, the pillar extending through the dielectric material, the pillar including a pillar segment in the first layer of the electrically conductive material;
        a first shield structure in the first layer of the electrically conductive material and positioned between the pillar segment and the gate region;
        a tap interconnect formed from the electrically conductive material, the tap interconnect being in electrical contact with the gate region, the tap interconnect extending through the dielectric material; and
        a second shield structure formed from the electrically conductive material, the second shield structure being formed in at least the second layer, wherein the second shield structure is not formed in the first layer, and the second shield structure is configured to block an electric field between the tap interconnect and the pillar.

11. The transistor of claim 10 wherein:
    the tap interconnect forms a portion of an input to the gate region; and
    the pillar forms a portion of an output from the first terminal.

12. An amplifier module comprising:
    a substrate with a mounting surface; and
    a transistor coupled to the mounting surface of the substrate, the transistor including:
        a semiconductor substrate having a first terminal and a gate region;
        an interconnect structure on an upper surface of the semiconductor substrate, the interconnect structure being formed of multiple layers of dielectric material and electrically conductive material, the electrically conductive material including at least a first layer and a second layer spaced apart from the first layer by a first dielectric layer of the dielectric material, the first layer residing closest to the upper surface of the semiconductor substrate relative to the second layer, and wherein the interconnect structure includes:
- a pillar formed from the electrically conductive material, the pillar being in electrical contact with the first terminal, the pillar extending through the dielectric material, the pillar including a pillar segment in the first layer of the electrically conductive material; and
- a shield structure in the first layer of the electrically conductive material and positioned between the pillar segment and the gate region; and a ground plane formed in the first layer of the interconnect structure, and the shield structure is electrically connected to the ground plane.

13. The amplifier module of claim 12 wherein the shield structure is coupled with the upper surface of the semiconductor substrate without an intervening layer of the electrically conductive material, and the shield structure is electrically isolated from the pillar and the gate region.

14. The amplifier module of claim 12 further comprising a connection structure formed in the first layer of the interconnect structure, the connection structure overlapping the gate region, and the connection structure interconnecting the shield structure with the ground plane.

15. The amplifier module of claim 12 wherein:
the gate region includes first and second gate fingers, each of the first and second gate fingers being characterized by a length;
the interconnect structure further comprises a plurality of pillars aligned with the length of the first and second gate fingers, the pillar being one of the plurality of pillars, each of the plurality of pillars including the pillar segment in the first layer of the electrically conductive material; and
the shield structure includes:
- a first shield trace longitudinally aligned with the length of the first gate finger and positioned between the first gate finger and a first side of the plurality of pillars; and
- a second shield trace longitudinally aligned with the length of the second gate finger and positioned between the second gate finger and a second side of the plurality of pillars.

16. An amplifier module comprising:
a substrate with a mounting surface; and
a transistor coupled to the mounting surface of the substrate, the transistor including:
- a semiconductor substrate having a first terminal and a gate region; and
- an interconnect structure on an upper surface of the semiconductor substrate, the interconnect structure being formed of multiple layers of dielectric material and electrically conductive material, the electrically conductive material including at least a first layer and a second layer spaced apart from the first layer by a first dielectric layer of the dielectric material, the first layer residing closest to the upper surface of the semiconductor substrate relative to the second layer, and wherein the interconnect structure includes:
  - a pillar formed from the electrically conductive material, the pillar being in electrical contact with the first terminal, the pillar extending through the dielectric material, the pillar including a pillar segment in the first layer of the electrically conductive material;
  - a first shield structure in the first layer of the electrically conductive material and positioned between the pillar segment and the gate region;
  - a tap interconnect formed from the electrically conductive material, the tap interconnect being in electrical contact with the gate region, the tap interconnect extending through the dielectric material, and the tap interconnect forming a portion of an input to the gate region; and
  - a second shield structure formed from the electrically conductive material, the second shield structure being formed in at least the second layer, wherein the second shield structure is not formed in the first layer, the second shield structure is configured to block an electric field between the tap interconnect and the pillar, and the pillar forms a portion of an output from the first terminal.

17. A method of manufacturing a transistor comprising:
providing a semiconductor substrate having a first terminal and a gate region; and
forming an interconnect structure on an upper surface of the semiconductor substrate of multiple layers of dielectric material and electrically conductive material, the forming the interconnect structure comprising:
forming a pillar from the electrically conductive material, the pillar electrically contacting the first terminal, the pillar extending through the dielectric material, wherein the forming the pillar includes forming a first pillar segment in a first layer of the electrically conductive material, the first layer residing closest to the upper surface of the semiconductor substrate without an intervening layer of the electrically conductive material; and
forming a shield structure in the first layer of the electrically conductive material and positioned between the pillar segment and the gate region; and
forming a ground plane in the first layer of the electrically conductive material; and forming a connection structure overlapping the gate region, the connection structure interconnecting the shield structure to the ground plane, and the shield structure, connection structure, and ground plane being electrically isolated from the gate region.

\* \* \* \* \*

UNITED STATES PATENT AND TRADEMARK OFFICE
CERTIFICATE OF CORRECTION

| | |
|---|---|
| PATENT NO. | : 10,593,619 B1 |
| APPLICATION NO. | : 16/114468 |
| DATED | : March 17, 2020 |
| INVENTOR(S) | : Ibrahim Khalil et al. |

It is certified that error appears in the above-identified patent and that said Letters Patent is hereby corrected as shown below:

On the Title Page

(73) Assignee: NSP USA, Inc., Austin, TX (US)
Should read:
(73) Assignee: NXP USA, Inc., Austin, TX (US)

Signed and Sealed this
Twenty-first Day of February, 2023

Katherine Kelly Vidal
*Director of the United States Patent and Trademark Office*